United States Patent
Schwartz et al.

(10) Patent No.: US 10,371,468 B2
(45) Date of Patent: Aug. 6, 2019

(54) CO-EXTRUDED MICROCHANNEL HEAT PIPES

(75) Inventors: David Eric Schwartz, San Carlos, CA (US); Ranjeet Balakrishna Rao, Mountain View, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 1562 days.

(21) Appl. No.: 13/308,519

(22) Filed: Nov. 30, 2011

(65) Prior Publication Data
US 2013/0133863 A1     May 30, 2013

(51) Int. Cl.
| | |
|---|---|
| F28D 15/04 | (2006.01) |
| F28F 21/08 | (2006.01) |
| F28F 21/06 | (2006.01) |
| F28D 15/02 | (2006.01) |
| H01L 23/427 | (2006.01) |
| B23P 15/26 | (2006.01) |

(52) U.S. Cl.
CPC ............. *F28F 21/08* (2013.01); *B23P 15/26* (2013.01); *F28D 15/0233* (2013.01); *F28D 15/04* (2013.01); *F28F 21/062* (2013.01); *H01L 23/427* (2013.01); *B23P 2700/09* (2013.01); *F28D 15/046* (2013.01); *F28F 2255/16* (2013.01); *F28F 2260/02* (2013.01); *H01L 2924/0002* (2013.01)

(58) Field of Classification Search
CPC .............................. F28D 15/04; F28D 15/046
USPC ................... 165/80.2, 104.26, 80.3, 80.4; 29/890.032; 361/700
See application file for complete search history.

(56) References Cited

U.S. PATENT DOCUMENTS

| | | | |
|---|---|---|---|
| 2,031,387 A | 2/1936 | Schwarz |
| 2,313,296 A | 3/1943 | Lamesch |
| 2,326,803 A | 8/1943 | Samiran |
| 2,761,791 A | 9/1956 | Russell |

(Continued)

FOREIGN PATENT DOCUMENTS

| | | |
|---|---|---|
| DE | 102006011580 B3 | 10/2007 |
| EP | 1787786 A | 5/2007 |

(Continued)

OTHER PUBLICATIONS

Finlayson et al. "Bi2O3—Wo3 compounds for photocatalytic applications by solid state and viscous processing", Title from a conference scheduled for Oct. 6-7, 2004 in Munich, 8 pages.

(Continued)

*Primary Examiner* — Joel Attey
(74) *Attorney, Agent, or Firm* — Bever, Hoffman & Harms, LLP

(57) ABSTRACT

A microchannel heat pipe formed on a substrate surface using co-extruding a primary material and a secondary material such that the primary material forms side wall portions that are spaced apart by the secondary material, and an upper wall portion is formed across the upper ends of the side walls to form a composite structure. After the primary material hardens, the secondary material is removed, whereby the hardened primary material forms a pipe body having an elongated central channel defined between opposing end openings. A working fluid is then inserted into the elongated central channel, and sealing structures are then formed over both end openings to encapsulate the working fluid.

19 Claims, 14 Drawing Sheets

(56) References Cited

U.S. PATENT DOCUMENTS

| | | |
|---|---|---|
| 2,789,731 A | 4/1957 | Marraffino |
| 3,032,008 A | 5/1962 | Land et al. |
| 3,159,313 A | 12/1964 | Guilford |
| 3,602,193 A | 8/1971 | Adams et al. |
| 4,018,269 A * | 4/1977 | Honda et al. ............ 165/104.26 |
| 4,018,367 A | 4/1977 | Morine et al. |
| 4,046,190 A * | 9/1977 | Marcus et al. ........... 165/104.26 |
| 4,047,198 A * | 9/1977 | Sekhon et al. ................ 257/713 |
| 4,106,171 A | 8/1978 | Basiulis |
| 4,119,058 A | 10/1978 | Schmermund |
| 4,141,231 A | 2/1979 | Kudlich |
| 4,254,894 A | 3/1981 | Fetters |
| 4,301,322 A | 11/1981 | Amick |
| 4,356,217 A | 10/1982 | Wollam et al. |
| 4,411,218 A | 10/1983 | Wollam et al. |
| 4,418,640 A | 12/1983 | Dettelbach et al. |
| 4,420,510 A | 12/1983 | Kunkel et al. |
| 4,461,403 A | 7/1984 | Prahs |
| 4,476,165 A | 10/1984 | McIntyre |
| 4,488,665 A | 12/1984 | Cocks et al. |
| 4,490,418 A | 12/1984 | Yoshida |
| 4,521,457 A | 6/1985 | Russell et al. |
| 4,747,517 A | 5/1988 | Hart |
| 4,774,109 A | 9/1988 | Hadzimihalis et al. |
| 4,814,029 A | 3/1989 | Butcher |
| 4,938,994 A | 7/1990 | Choinski |
| 4,976,999 A | 12/1990 | Ishizuka |
| 4,985,715 A | 1/1991 | Cyphert et al. |
| 5,000,988 A | 3/1991 | Inoue et al. |
| 5,029,389 A * | 7/1991 | Tanzer ..................... 29/890.032 |
| 5,120,484 A | 6/1992 | Cloeren |
| 5,151,377 A | 9/1992 | Hanoka et al. |
| 5,179,043 A * | 1/1993 | Weichold et al. ............ 438/584 |
| 5,188,789 A | 2/1993 | Nishiura |
| 5,254,388 A | 10/1993 | Melby et al. |
| 5,317,805 A | 6/1994 | Hoopman et al. |
| 5,335,825 A | 8/1994 | Fort |
| 5,353,813 A | 10/1994 | Deevi et al. |
| 5,533,675 A | 7/1996 | Benecke et al. |
| 5,536,313 A | 7/1996 | Watanabe et al. |
| 5,560,518 A | 10/1996 | Catterall et al. |
| 5,590,818 A | 1/1997 | Raba et al. |
| 5,605,720 A | 2/1997 | Allen et al. |
| 5,679,379 A | 10/1997 | Fabricante et al. |
| 5,685,911 A | 11/1997 | Raterman et al. |
| 5,700,325 A | 12/1997 | Watanabe |
| 5,720,820 A | 2/1998 | Boger et al. |
| 5,725,814 A | 3/1998 | Harris |
| 5,733,608 A | 3/1998 | Kessel et al. |
| 5,756,163 A | 5/1998 | Watanabe |
| 5,770,129 A | 6/1998 | Monti |
| 5,873,495 A | 2/1999 | Saint-Germain |
| 5,918,771 A | 7/1999 | van der Heijden |
| 5,961,767 A | 10/1999 | Aksyuk et al. |
| 6,047,862 A | 4/2000 | Davies |
| 6,184,458 B1 | 2/2001 | Murakami et al. |
| 6,216,343 B1 * | 4/2001 | Leland et al. ........... 29/890.032 |
| 6,228,134 B1 | 5/2001 | Erickson |
| 6,248,171 B1 | 6/2001 | Gurer et al. |
| 6,257,450 B1 | 7/2001 | Jackson et al. |
| 6,270,335 B2 | 8/2001 | Leyden et al. |
| 6,293,498 B1 | 9/2001 | Stanko et al. |
| 6,375,311 B1 | 4/2002 | Kuramoto |
| 6,398,370 B1 | 6/2002 | Chiu et al. |
| 6,418,986 B1 | 7/2002 | Gabriele |
| 6,423,140 B1 | 7/2002 | Liu et al. |
| 6,478,997 B2 * | 11/2002 | McCullough ................ 264/108 |
| 6,529,220 B1 | 3/2003 | Matsumoto |
| 6,534,129 B1 | 3/2003 | Miller et al. |
| 6,558,146 B1 | 5/2003 | Shah et al. |
| 6,666,165 B2 | 12/2003 | Shiraishi et al. |
| 6,669,779 B2 | 12/2003 | Gurer et al. |
| 6,689,215 B2 | 2/2004 | Nguyen |
| 6,695,923 B1 | 2/2004 | Schultz et al. |
| 6,697,694 B2 | 2/2004 | Mogensen |
| 6,743,478 B1 | 6/2004 | Kiiha et al. |
| 6,749,414 B1 | 6/2004 | Hanson et al. |
| 6,799,628 B1 * | 10/2004 | Masseth ............. H01L 23/3731 |
| | | 165/185 |
| 6,863,923 B1 | 3/2005 | Kalleder et al. |
| 6,880,626 B2 * | 4/2005 | Lindemuth et al. ..... 165/104.26 |
| 6,890,167 B1 | 5/2005 | Kwok et al. |
| 6,915,843 B2 * | 7/2005 | Kroliczek et al. ........ 165/104.33 |
| 6,955,348 B2 | 10/2005 | Koga |
| 6,998,087 B1 | 2/2006 | Hanson et al. |
| 7,040,555 B2 | 5/2006 | Miinalainen et al. |
| 7,101,592 B2 | 9/2006 | Gueggi et al. |
| RE39,399 E | 11/2006 | Allen |
| 7,137,443 B2 * | 11/2006 | Rosenfeld et al. ....... 165/104.26 |
| 7,160,574 B1 | 1/2007 | Gillanders et al. |
| 7,255,896 B2 | 8/2007 | Kawabe |
| 7,332,035 B1 | 2/2008 | Tudor et al. |
| 7,360,309 B2 | 4/2008 | Vaidyanathan et al. |
| 7,467,452 B2 | 12/2008 | Lande et al. |
| 7,543,380 B2 * | 6/2009 | Hou et al. ................ 29/890.032 |
| 7,765,949 B2 | 8/2010 | Fork et al. |
| 7,780,812 B2 | 8/2010 | Fork et al. |
| 7,799,371 B2 | 9/2010 | Fork et al. |
| 8,080,181 B2 | 12/2011 | Fork et al. |
| 8,707,891 B2 | 4/2014 | Arnaboldi |
| 8,859,887 B2 | 10/2014 | Tsuruga et al. |
| 2001/0046551 A1 | 11/2001 | Falck et al. |
| 2001/0053420 A1 | 12/2001 | Donges et al. |
| 2002/0083895 A1 | 7/2002 | Nakamura et al. |
| 2002/0166232 A1 | 11/2002 | Fujita et al. |
| 2003/0015820 A1 | 1/2003 | Yamazaki et al. |
| 2003/0070677 A1 | 4/2003 | Handique et al. |
| 2003/0084845 A1 | 5/2003 | Prentice et al. |
| 2003/0102385 A1 | 6/2003 | Nguyen |
| 2003/0180409 A1 | 9/2003 | Kazmer et al. |
| 2003/0201581 A1 | 10/2003 | Weber et al. |
| 2004/0188068 A1 * | 9/2004 | Luo et al. ................ 165/104.26 |
| 2004/0231830 A1 * | 11/2004 | Luo ........................... 165/104.26 |
| 2004/0247794 A1 | 12/2004 | Tokimasa et al. |
| 2004/0259382 A1 | 12/2004 | Nishimura et al. |
| 2004/0265407 A1 | 12/2004 | Prugh et al. |
| 2005/0037145 A1 | 2/2005 | Kawabe |
| 2005/0067729 A1 | 3/2005 | Laver et al. |
| 2005/0077470 A1 * | 4/2005 | Wong ...................... 165/104.26 |
| 2005/0194037 A1 | 9/2005 | Asai |
| 2005/0221613 A1 | 10/2005 | Ozaki et al. |
| 2005/0224109 A1 | 10/2005 | Posbic |
| 2005/0241575 A1 | 11/2005 | Schneider |
| 2005/0241807 A1 * | 11/2005 | Jankowski et al. ...... 165/104.26 |
| 2006/0060135 A1 | 3/2006 | Rankin, Jr. et al. |
| 2006/0113662 A1 * | 6/2006 | Cepeda-Rizo ................ 257/714 |
| 2006/0158473 A1 | 7/2006 | Mills et al. |
| 2007/0108229 A1 | 5/2007 | Fork et al. |
| 2007/0110836 A1 | 5/2007 | Fork et al. |
| 2007/0130769 A1 * | 6/2007 | Moon et al. ............ 29/890.032 |
| 2007/0151710 A1 | 7/2007 | Touzov |
| 2007/0209697 A1 | 9/2007 | Karakida et al. |
| 2007/0240856 A1 * | 10/2007 | Liu et al. ................ 165/104.26 |
| 2007/0295494 A1 * | 12/2007 | Mayer et al. ................. 165/170 |
| 2008/0029152 A1 | 2/2008 | Milshtein et al. |
| 2008/0110939 A1 | 5/2008 | Frates |
| 2008/0138456 A1 | 6/2008 | Fork et al. |
| 2008/0264611 A1 * | 10/2008 | Chang et al. ............ 165/104.26 |
| 2009/0056912 A1 * | 3/2009 | Kerber ...................... 165/104.13 |
| 2009/0056917 A1 * | 3/2009 | Majumdar et al. ...... 165/104.26 |
| 2009/0101190 A1 | 4/2009 | Salami et al. |
| 2009/0159243 A1 * | 6/2009 | Zhao et al. .............. 165/104.26 |
| 2009/0166014 A1 * | 7/2009 | Chang et al. ................. 165/133 |
| 2010/0008043 A1 * | 1/2010 | Yajima et al. ................ 361/700 |
| 2010/0116199 A1 | 5/2010 | Fork et al. |
| 2010/0117254 A1 | 5/2010 | Fork et al. |
| 2010/0126701 A1 * | 5/2010 | Hou ........................ 165/104.26 |
| 2010/0143581 A1 | 6/2010 | Eldershaw |
| 2010/0200199 A1 * | 8/2010 | Habib et al. ............. 165/104.26 |
| 2010/0212871 A1 * | 8/2010 | Hsieh et al. ............. 165/104.26 |
| 2010/0221435 A1 | 9/2010 | Fork et al. |
| 2010/0254090 A1 * | 10/2010 | Trautman ..................... 361/704 |
| 2011/0052811 A1 | 3/2011 | McGuffey |
| 2011/0052812 A1 | 3/2011 | McGuffey |

(56) References Cited

U.S. PATENT DOCUMENTS

| | | |
|---|---|---|
| 2012/0156364 A1 | 6/2012 | Fork et al. |
| 2012/0180936 A1 | 7/2012 | Schuler |
| 2014/0034682 A1 | 2/2014 | McGuffey |

FOREIGN PATENT DOCUMENTS

| | | |
|---|---|---|
| EP | 1918245 A2 | 5/2008 |
| EP | 2196316 A1 | 6/2010 |
| EP | 2197035 A2 | 6/2010 |
| JP | 60082680 A | 5/1985 |
| JP | 05-031786 A | 2/1993 |
| JP | 2005051216 | 2/2005 |
| WO | 91/15355 | 10/1991 |
| WO | 00/50215 | 8/2000 |
| WO | 03/076701 A | 9/2003 |
| WO | 2005/070224 A1 | 8/2005 |
| WO | 2005/107957 A1 | 11/2005 |
| WO | 2005/107958 A1 | 11/2005 |
| WO | WO2010061394 A1 | 6/2010 |

OTHER PUBLICATIONS

Mueller et al. "Breathable Polymer Films Produced by the Microlayer Coextrusion Process", Journal of Applied Polymer Science, vol. 78, pp. 816-828, 2000.

Schweizer, Peter M. "Curtain Coating Technology Can Mean Big Benefits", Paper, Film & Foil Converter website, Mar. 1, 2000, 5 pages, http://pffc-online.com/mag/paper_curtain_coating_technology/.

Extrusion/Coextrusion Dies, Extrusion Dies Industries, LLC, http://www.extrusiondies.com/PRODUCTS/ExtrusionDies/multimanifold-Dies.html, 1 page.

Citsco, Gimac Compact Triplex TR12 Micro-Coextrusion Plant, NPE 2000, Jun. 19-23, 2000, McCormick Place, Chicago, IL, Booth 13154, http://www.citsco.com/NPE2000/npepage1.html, 2 pages.

Rao et al. "Microfabricated Deposition Nozzles for Direct-Write Assembly of Three-Dimensional Periodic Structures", Advanced Materials, vol. 17, No. 3, Feb. 10, 2005, pp. 289-293.

Van Hoy et al. "Microfabrication of Ceramics by Co-extrusion", J. Am. Ceram. Soc., vol. 81, No. 1, pp. 152-158, 1998.

Duncan, A. B. et al. "Charge Optimization for a Triangular-Shaped Etched Micro Heat Pipe", J. Thermophysics, 1994, vol. 9, No. 2, Technical Notes, pp. 365-368.

Joshi et al. "Micro and Meso Scale Compact Heat Exchangers in Electronics Thermal Management—A Review", Proc. of 5th Int. Conf. on Enhanced, Compact and Ultra-Compact Heat Exchangers: Science, Engineering and Technology, Eds. R. K. Shah et al., Engineering Conferences International, Hoboken, NJ, USA, Sep. 2005, pp. 162-179.

Le Berre et al. "Fabrication and experimental investigation of silicon micro heat pipes for cooling electronics", J. Micromech. Microeng. 13 (2003) 436-441.

Sobhan, Choondal B. "Modeling of the Flow and Heat Transfer in Micro Heat Pipes", ASME 2nd International Conference on Microchannels and Minichannels, 2004, pp. 883-890.

Sobhan, C. B. et al. "A review and comparative study of the investigations on micro heat pipes", Int. J. Energy Res., 2007, vol. 31, pp. 664-688.

Wang, Y. X. et al. "Investigation of the Temperature Distribution on Radiator Fins with Micro Heat Pipes", J. Thermophysics and Heat Transfer, vol. 15, No. 1, Jan.-Mar. 2001, pp. 42-49.

\* cited by examiner

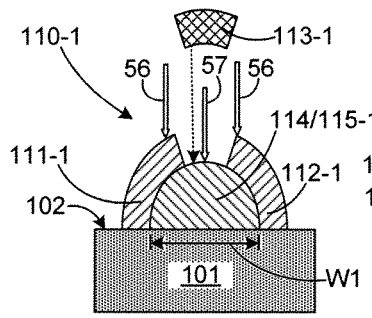
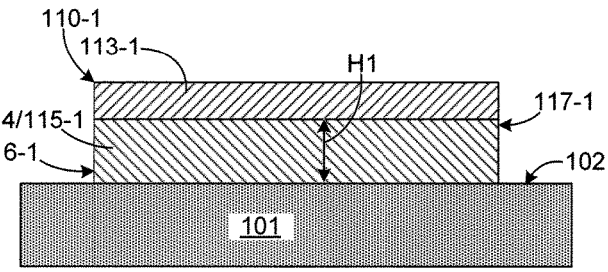
FIG. 3(A)   FIG. 4(A)
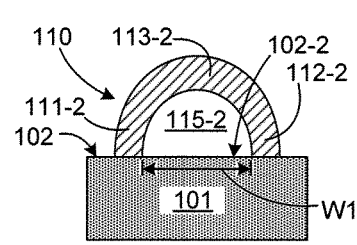
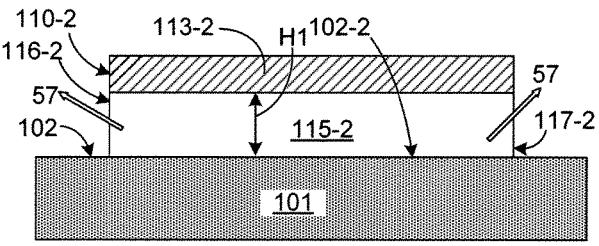
FIG. 3(B)   FIG. 4(B)
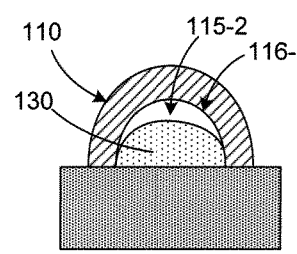
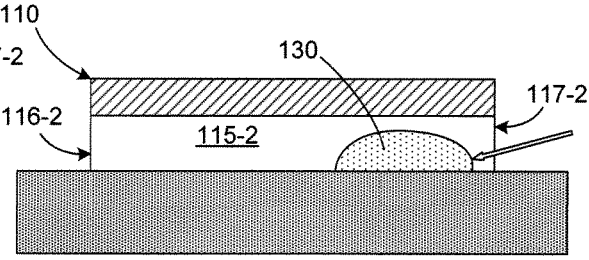
FIG. 3(C)   FIG. 4(C)
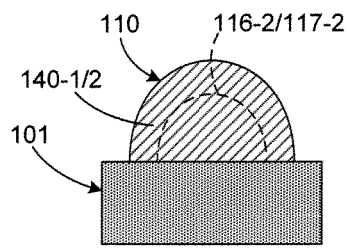
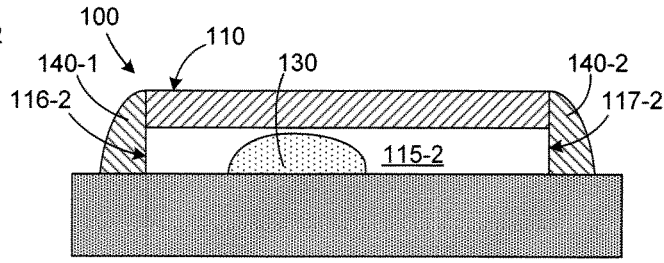
FIG. 3(D)   FIG. 4(D)

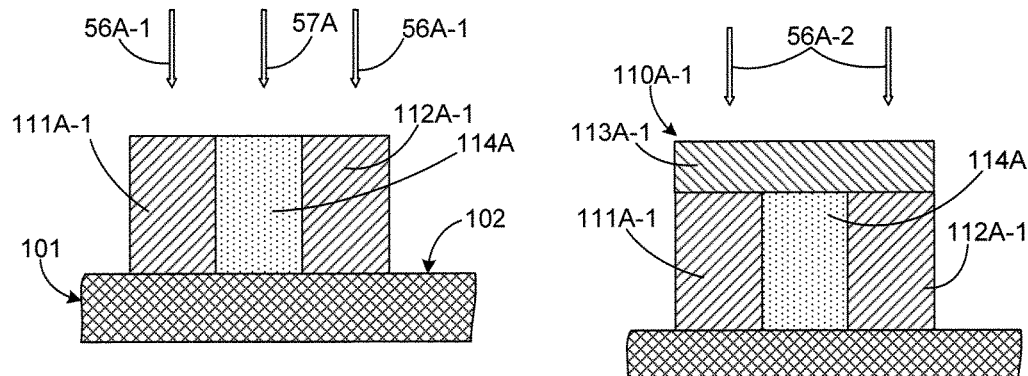
FIG. 10(A)
FIG. 10(B)
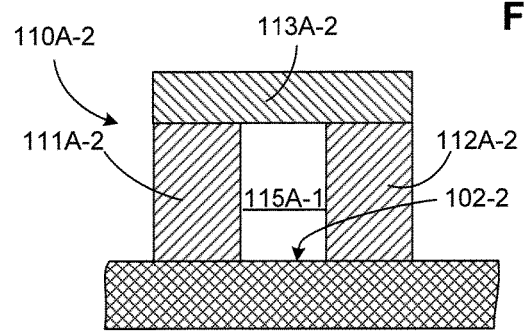
FIG. 10(C)
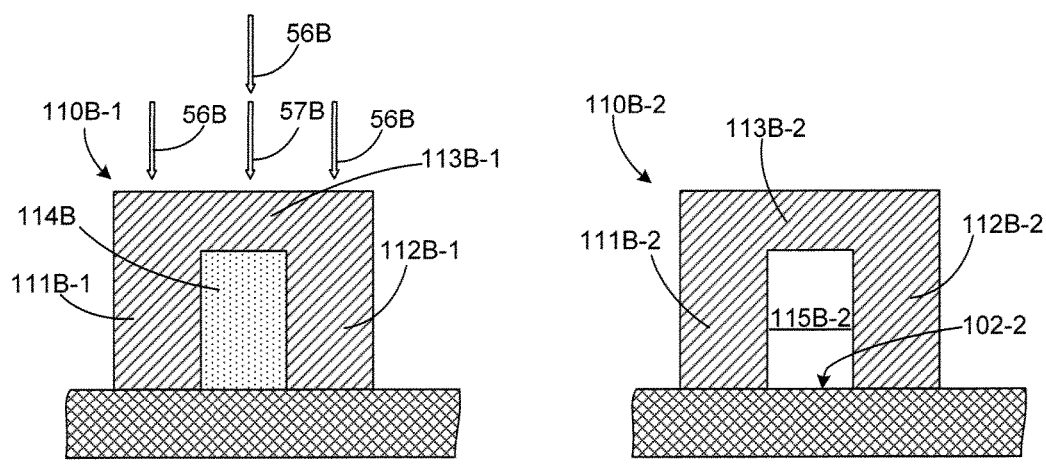
FIG. 11(A)　　　　FIG. 11(B)

CO-EXTRUDED MICROCHANNEL HEAT PIPES

FIELD OF THE INVENTION

This invention relates to microchannel heat pipes and devices that include microchannel heat pipes, and more particularly methods for producing microchannel heat pipes on such devices.

BACKGROUND OF THE INVENTION

Heat pipes are heat transfer devices with high effective thermal conductivities that are used to transfer heat from a high temperature region to a low temperature region by way of a heat transfer fluid (referred to herein as a "working fluid"), whereby a temperature at the high region may be stabilized or reduced.

Microchannel heat pipes are heat pipes having a closed channel with a small (often on the order of tens of micrometers) and angled (often triangular) cross section, and are partially filled with a working fluid (often methanol, ethanol, water, acetone, or ammonia). One end of the heat pipe (the "evaporator" section) is placed in contact with a relatively high temperature region of a host device (e.g., an integrated circuit or a system including both an integrated circuit and an adjacent heat sink), and the other end (the "condenser" section) is placed in contact with a relatively low temperature region of the host device. In operation, heat generated in the high temperature region of the host device is absorbed at the high temperature end of the microchannel heat pipe, causing liquid working fluid to boil. The relatively high pressure thus generated at the high temperature end forces the resulting vaporized working fluid towards the low temperature end of the heat pipe, where the vapor condenses again to liquid working fluid, thus releasing heat. The resulting difference between the curvature of the liquid-vapor interface at the hot and cold ends of the microchannel heat pipe results in a capillary force by which the liquid working fluid flows from the low temperature end back to the high temperature end.

Microchannel heat pipes are distinguished from conventional heat pipes in that conventional heat pipes must include a wicking structure to affect the capillary pressure difference, while in microchannel heat pipes the capillary pressure difference is a result of the small lateral dimensions of the elongated channel (central channel). The amount of fluid, cross-section size and shape, fluid properties, hot and cold temperatures, etc., determine the amount of heat that is moved from the high temperature end to the low temperature end. Heat fluxes of 10,000 W/cm$^2$ have been demonstrated. Wire bonded micro heat pipe arrays have been fabricated with thermal conductivities up to 3000 W/mK, and models have shown that transient specific thermal conductivities of up to 200 times that of copper, and steady state thermal conductivities up to 2500 times that of copper should be possible.

Integrated circuits (ICs) are an example of devices that have been shown to benefit from microchannel heat pipes. As the feature size of integrated circuits (ICs) decreases and transistor density increases, the heat flux of ICs increases and thermal management becomes more difficult. This is true of conventional and high power electronic chips. Circuit performance degrades significantly as temperature increases, so effective thermal management is important. The addition of microchannel heat pipes to ICs has been shown in laboratory settings to provide effective thermal management.

Although the beneficial heat transfer performance of microchannel heat pipes has been demonstrated in laboratory environments, they are nonetheless not commonly used in commercial devices due to the high cost of incorporating the addition of microchannel heat pipes using conventional methods. One conventional microchannel heat pipe manufacturing technique includes etching or machining a channel in the device's (e.g., silicon) substrate, and then sealing the channel with a second wafer. Another conventional microchannel heat pipe manufacturing technique includes sintering to generate an array of parallel wires between metal sheets. Such conventional methods require significant changes to a conventional production IC fabrication flow, and therefore greatly increase the overall manufacturing costs of the resulting IC devices.

What is needed is a cost-effective method for producing microchannel heat pipes that can be efficiently incorporated, for example, onto an IC (e.g., as part of the IC fabrication process, or produced on the IC after the IC fabrication process, or fabricated on a separated substrate that is then attached to a fabricated IC). What is also needed are inexpensive microchannel heat pipes formed by the method, and devices that are modified to include such inexpensive microchannel heat pipes.

SUMMARY OF THE INVENTION

The present invention is directed to a microchannel heat pipe including a pipe body formed entirely by extruded primary material that is deposited on the surface of a substrate using an inexpensive co-extrusion process, and then cured or otherwise hardened to provide a pipe structure. Because the pipe body is formed using an inexpensive extruded material, the microchannel heat pipe can be efficiently incorporated, for example, onto an IC (e.g., either directly as part of the IC fabrication process, or produced on the IC after the IC fabrication process, or fabricated on a separated substrate that is then attached to a fabricated IC).

According to an aspect of the present invention, the pipe body of each microchannel heat pipe includes first and second elongated side wall portions that are disposed on the substrate surface and are separated by an elongated central channel (void), and an upper wall portion extending between upper ends of the first and second elongated side wall portions over the elongated central channel. That is, the elongated central channel is defined by inside surfaces of the first and second elongated side wall portions, an inside surface of the upper wall portion, and an upward-facing surface portion of the substrate surface that extends between said first and second elongated side portions. In addition, a working fluid encapsulated inside the elongated central channel, e.g., by way of end structures, that functions to transfer heat in a manner similar to that utilized in conventional microchannel heat pipes.

According to an embodiment of the present invention, the entire pipe body of each microchannel heat pipe (i.e., the first and second elongated side wall portions and the upper wall portion) are composed of a common material (i.e., the cured or otherwise hardened form of a single extruded "primary" material) that forms an integral structure. Practical elongated pipe bodies have nominal widths in the range of 10 micrometers to 500 micrometers, lengths in the range of 100 micrometers to 20 centimeters, and nominal heights in the range of 25 micrometers to 500 micrometers. The common material forming the pipe body includes one or more of silver, copper, nickel, tin, aluminum, steel, alumina, silicates, glasses, carbon black, polymers and wax. In one specific embodiment a metal included in the pipe body is sintered. By modifying the co-extrusion process utilizing methods described below, the pipe body is formed with a cross-sectional shape that is either substantially semi-circular, substantially square, substantially rectangular, pseudo-trapezoidal or pseudo-triangular. Because any of these pipe body structures is achievable using the novel and cost-efficient co-extrusion production method described below, and each pipe body construction is distinguished over conventional trench-type and wire-type heat pipes in that it can be entirely formed using a single co-extrusion process.

According to another aspect of the present invention, each microchannel heat pipe includes a working fluid that is encapsulated inside the elongated central channel of the pipe body. In exemplary embodiments the working fluid includes one of methanol, ethanol, water, acetone, and ammonia (or another suitable fluid) that is selected based on the working environment in which the microchannel heat pipe will be used. In other embodiments, encapsulation of the working fluid inside the elongated central channel is achieved by forming sealing structures over opposing end openings defined in the pipe body that communicate with the elongated central channel. In exemplary embodiments the sealing structures include one of epoxy, silicone and solder.

According to an embodiment of the present invention, each pipe body of each microchannel heat pipe comprises polymer walls that are formed after the extrusion process by activating materials provided in either the primary or secondary (sacrificial) extrusion materials (or both). An advantage of this structure is that the fabrication process and resulting pipe body structure are compatible with conventional IC fabrication techniques.

According to an embodiment of the present invention, a host device (e.g., an IC device or system) includes multiple microchannel heat pipe formed in accordance with the features described above, where one end of each microchannel heat pipe is disposed over an active (heat generating) region of the host device, and the other end is positioned over an inactive (heat sink or otherwise cool) region of the host device.

BRIEF DESCRIPTION OF THE DRAWINGS

These and other features, aspects and advantages of the present invention will become better understood with regard to the following description, appended claims, and accompanying drawings, where:

FIGS. 3(A), 3(B), 3(C) and 3(D) are simplified cross-sectional end views showing the formation of the microchannel heat pipe of FIG. 1 according to the generalized method of FIG. 2;

FIGS. 4(A), 4(B), 4(C) and 4(D) are simplified cross-sectional side views showing the formation of the microchannel heat pipe of FIG. 1 according to the generalized method of FIG. 2;

FIGS. 10(A), 10(B) and 10(C) are cross-sectional side views illustrating the formation of a co-extruded pipe structure according to a first specific embodiment of the present invention;

FIGS. 11(A) and 11(B) are cross-sectional side views illustrating the formation of a co-extruded pipe structure according to a second specific embodiment of the present invention;

DETAILED DESCRIPTION OF THE DRAWINGS

The present invention relates to an improvement in micro-extrusion systems. The following description is presented to enable one of ordinary skill in the art to make and use the invention as provided in the context of a particular application and its requirements. As used herein, directional terms such as "upper", "top", "lower", "bottom", "front", "side" and "rear" are intended to provide relative positions for purposes of description, and are not intended to designate an absolute frame of reference. In addition, the phrase "integral structure" is used herein to describe a structure including wall portions that are chemically bonded or otherwise joined without an intervening fastening material such as an adhesive or solder. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
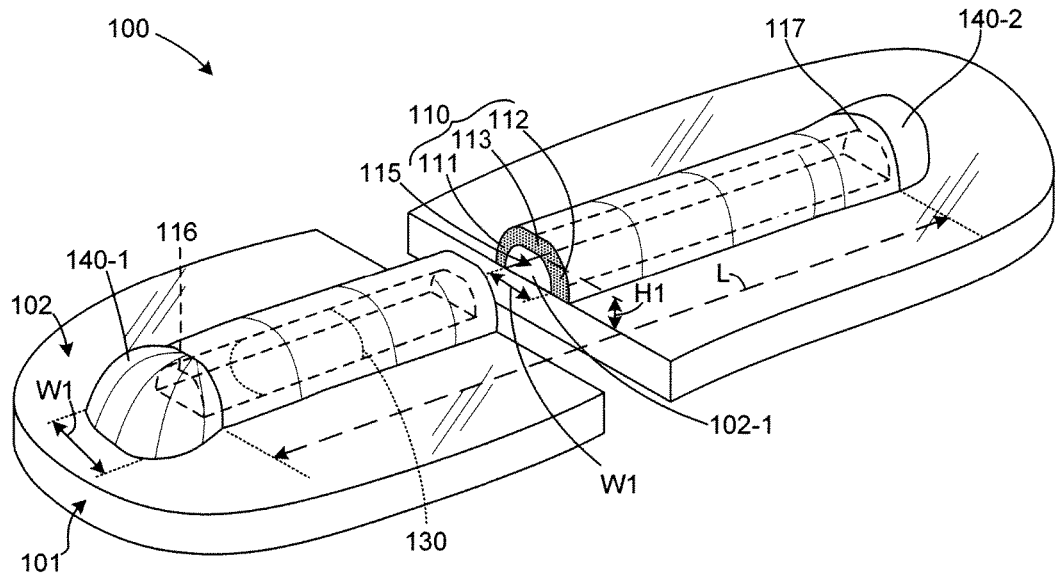
FIG. 1 is a partial perspective view showing a microchannel heat pipe produced in accordance with an embodiment of the present invention.

FIG. 1 is a top perspective view showing a microchannel heat pipe 100 disposed on the upper surface 102 of a substrate 101 according to an exemplary embodiment of the present invention. Microchannel heat pipe 100 is formed on substrate 101 utilizing the method set forth below, and generally includes an elongated pipe body 112 that defines, in conjunction with a surface portion 102-1 of substrate 101, an elongated central channel 115 containing an amount of working fluid 130, and end seal structures 140-1 and 140-2 that are respectively disposed over opposing ends of elongated central channel 115 such that working fluid 130 is encapsulated (sealed) inside elongated central channel 115. Microchannel heat pipe 100 operates in a manner consistent with conventional microchannel heat pipes in that heat from a relatively high temperature applied at one end is absorbed in the form of vaporized working fluid, and is rejected the opposite (condenser) end, which is maintained at a relatively low temperature that causes condensation of the vaporized working fluid.

Referring to the middle of FIG. 1, elongated pipe body 110 is an elongated structure having one of a generally semi-circular (shown), pseudo triangular (preferred) or pseudo trapezoidal cross section that is disposed on upper surface 102. For descriptive purposes, opposing side portions of elongated pipe body 110 are respectively referred to herein as first elongated side wall portion 111 and second elongated side wall portion 112, and the upper portion of elongated pipe body 110 is referred to as upper wall portion 113. Side wall portions 111 and 112 are disposed on surface 102 in a substantially parallel, spaced-apart manner along an entire length L of elongated pipe body 112 such that all portions of side wall portion 111 are spaced from corresponding opposing portions of side wall portion 112 by an elongated central channel 115 having a nominal channel width W1 (measured at upper surface 102). Upper wall portion 113 is supported by upper edges of elongated side wall portions 111 and 112 at a nominal channel height H1 (measured from upper surface 102 to the lower surface of upper wall portion 113), and extends along the entire length of first and second elongated side wall portions 111 and 112. Accordingly, elongated central channel 115 is defined (surrounded) by elongated side wall portions 111 and 112, upper wall portion 113, and a portion 102-1 of substrate surface 102 that extending between elongated side wall portions 111 and 112. Elongated central channel 115 extends the entire length L of pipe body 112 (i.e., between a first end opening 116 and a second end opening 117), and has a substantially constant cross-sectional area.

With reference to microchannel heat pipe 110 of FIG. 1, the phrase "microchannel heat pipe" is defined herein to heat pipe structures including a single elongated central channel having a nominal width W1 in the range of 10 micrometers to 500 micrometers, a length L in the range of 100 micrometers to 20 centimeters, and a nominal height H1 in the range of 25 micrometers to 500 micrometers. Optimal dimensions of microchannel heat pipe 110 are determined in each instance by, for example, the properties of the working fluid and working temperatures. In a typical exemplary embodiment, microchannel heat pipe 110 has a width dimension W1 in the range of 30-200 micrometers, a height H1 in the range of 30-200 micrometers, and a length dimension L in the range of 10-100 millimeters.

According to another aspect of the present invention, elongated pipe body 110 comprises one or more cured or otherwise hardened extruded materials having sufficient strength to withstand the internal pressures generated by working fluid 130. In one embodiment, the entirety of pipe body 110 (i.e., side wall portions 111 and 112 and upper wall portion 113) comprises an integral structure formed by a single (common) extruded material (i.e., the entire pipe body structure is formed from integrally connected wall portions having the same chemical composition that are generated during a single co-extrusion process involving a single primary material, and then subjected to a post-extrusion curing, sintering, polymerizing or other hardening process). In another embodiment, an integral structure is formed by side wall portions 111 and 112 of pipe body 110 are formed by a two extruded materials, and upper wall portion 113 is formed by a second extruded primary material, where both the first and second primary materials are subjected to a hardening process. As set forth below, in exemplary embodiments the cured or otherwise hardened material(s) of pipe body 110 includes one of silver, copper, nickel, tin, aluminum, steel, alumina, silicates, glasses, carbon black, polymers and wax, although the use of an ink/paste including a metal powder or ceramic in a solvent may require a post-processing step (e.g., sintering) to produce a fully dense shell. In one specific embodiment set forth below, the side and upper walls of pipe body 110 are polymer or wax. Such polymer (or wax) pipe bodies are presently preferred because they do not require a densifying step (e.g., sintering). Those skilled in the art will recognize that elongated pipe body structures may be formed using materials other than the exemplary materials mentioned herein.

Referring again to FIG. 1, working fluid 130 is disposed inside elongated central channel 115, and in exemplary embodiments consists of either methanol, ethanol, water, acetone, or ammonia. Other working fluids may also be utilized based on various parameters such as boiling point, partial pressure at different temperatures, the dimensions of the heat pipe, and the working temperatures. The amount of working fluid 130 disposed inside microchannel heat pipe 100 is determined by the volume of elongated central channel 115, and in an exemplary embodiment the amount may be approximately 50% of this channel volume, although the amount may be selected to fill 1% to 99% of the void (i.e., the channel volume).

End seal structures 140-1 and 140-2 are respectively formed using a sealant material that can withstand the temperatures to which microchannel heat pipe 100 will be exposed, and the pressure of the working fluid vapor during operation. Currently preferred sealants include epoxy and silicone, but solder or another metal can also be used.

Figure 2:
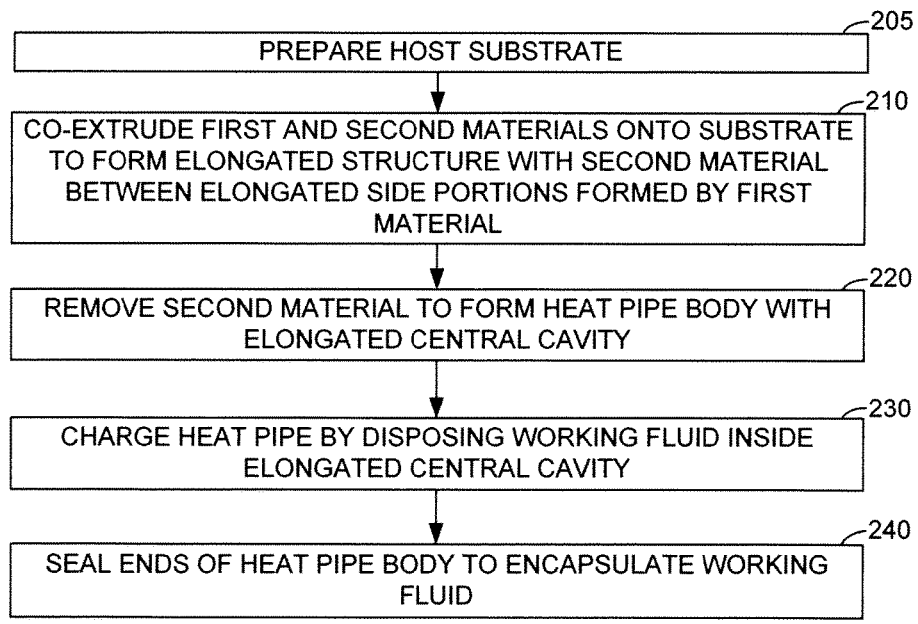
FIG. 2 is a simplified flow diagram indicating a generalized method for generating the microchannel heat pipe of FIG. 1 according to another embodiment of the present invention.

FIG. 2 is a flow diagram showing a simplified method for producing exemplary microchannel heat pipe 100 (see FIG. 1) in accordance with another embodiment of the present invention. Referring to the upper end of FIG. 2, the method begins by providing a suitable substrate upon which the microchannel heat pipe will be formed (block 205), forming the heat pipe structure on the substrate by co-extruding two materials (block 210), removing one of the materials to form an elongated central channel extending entirely through the heat pipe structure (block 220), charging the heat pipe structure with an amount of working fluid (block 230), and sealing the ends of the heat pipe to encapsulate the working fluid (block 240). Each of these method portions are described below in additional detail.

As indicated by block 205 at the top of FIG. 2, the process begins with the optional step of preparing the upper surface of a suitable substrate for production of a microchannel heat pipe, and may involve chemically treating the upper surface to produce suitable adherence between the subsequently extruded primary materials and the substrate. In one exemplary embodiment described below with reference to FIG. 9, the microchannel heat pipe production process is performed after the fabrication of an integrated circuit on a suitable semiconductor substrate (e.g., monocrystalline silicon), which the IC fabrication is performed, for example, using a known semiconductor (e.g., CMOS) fabrication technique. In other embodiments the microchannel heat pipes of the present invention are formed on "plain" (e.g., metal foil) substrates that are then transferred onto a host device. This optional step may be omitted when the process is utilized to form microchannel heat pipes on substrates or host devices that do not require pre-treatment.

FIGS. 3(A) to 3(D) and 4(A) to 4(D) depict the processes performed by blocks 210 to 240 of FIG. 2 in additional detail.

FIGS. 3(A) and 4(A) are simplified illustrations depicting the formation of an elongated composite structure 110-1 using a co-extrusion process in which a first material 56 and a second material 57 are simultaneously extruded onto a surface 102 of the substrate in accordance with block 210 of FIG. 2. As set forth in additional detail below, the co-extrusion process is carried out such that primary material 56 and secondary material 57 form an elongated composite structure 110-1. As indicated in FIG. 3(A), primary material 56 forms a first elongated side portion 111-1 and a second elongated side portion 112-1, and secondary material 57 forms an elongated bead 114 that entirely fills an elongated central region 115-1 disposed between first and second elongated side portions 111-1 and 112-1. As indicated in FIG. 4(A), side portions 111-1 and 112-1 and bead 114 extend the entire length of elongated structure 110-1 between a first end 116-1 and a second end 117-1. As described in additional detail below, a benefit of co-extruding primary material 56 and secondary material 57 in this manner is that, by controlling the extrusion process parameters and by selecting primary and secondary materials that do not intermix, first and second elongated side portions 111-1 and 112-1 are reliably produced at a predetermined sub-millimeter spacing (width W1) that is maintained by the presence of bead 114 until first and second elongated side portions 111-1 and 112-1 are cured or otherwise harden to form side walls of the desired pipe structure. Another benefit of the depicted co-extrusion process is that bead 114 is retained between side portions 111-1 and 112-1, thereby facilitating the use of secondary material 57 in a liquid form that facilitates easy removal.

Referring to the upper portion of FIG. 3(A), according to another aspect of the present invention, an upper portion 113-1 of elongated structure 110-1 is either simultaneously or subsequently deposited or otherwise formed over bead 114 in accordance with the various specific embodiments described below. Upper portion 113-1 can either be composed of primary material 56 or a third material that is compatible with primary material 56 such that a coherent pipe structure is produced after the curing/hardening process that is capable of encapsulating a working fluid. As indicated in FIG. 4(A), which shows upper portion 113-1 after deposition/formation, a benefit of forming upper portion 113-1 on bead 114 in this manner is that upper wall portion 113-1 is maintained at the desired spacing (height H1) by the presence of bead 114 until upper portion 113-1 is cured or otherwise harden to form an upper wall of the desired pipe structure.

As mentioned above, once the formation of elongated composite structure 110-1 is completed (i.e., with upper portion 113-1 disposed on bead 114, as indicated in FIG. 4(B), an optional curing process is performed (if needed) such that side portions 111-1 and 112-1 and upper portion 113-1 harden (or are utilized to produce) a rigid pipe structure. For descriptive purposes, the transition of the liquid or semi-liquid extruded structures that form the outer surface of elongated composite structure 110-1 to the solid, shell-like, pipe structure utilized in the final microchannel heat pipe structure is indicated herein by a change of the suffix "-1" to the suffix "2". That is, after curing/hardening is complete, elongated composite structure 110-1 becomes pipe body 110-2, with liquid/semi-liquid side portion 111-1 of elongated composite structure 110-1 being hardened to become side wall 111-2 of pipe body 110-2, side portion 112-1 being hardened to become side wall 112-2 of pipe body 110-2, and upper portion 113-1 becoming upper wall 113-2 of pipe body 110-2. Note that the hardening process may not involve a separate process step, and instead may occur immediately upon deposition of elongated composite structure 110-1 onto the target substrate. Note also that the transition of side portions 111-1 and 112-1 and upper portion 113-1 to side wall portions 111-2 and 112-2 and upper wall 113-2 may involve a chemical change to one or more of the co-extruded materials (e.g., the formation of a polymer structure, as described below with reference to FIGS. 12 and 13).

FIGS. 3(B) and 4(B) show pipe body 110-2 after the curing/hardening process is completed, and also depict the subsequent process of removing secondary material from the elongated central region of the co-extruded composite structure according to block 220 of FIG. 2. In particular, these figures show the result of the secondary material removal process, which is to define an elongated central channel 115-2 through pipe structure 110-2 that has substantially the same width W1 and height H1 of the removed secondary material bead. That is, as indicated in FIG. 3(B), elongated central channel 115-2 is defined by spaced-apart first and second side wall portions 111-2 and 112-2 and upper wall portion 113-2 of pipe body 110-2, and by surface portion 102-2, an as indicated in FIG. 4(B), elongated central channel 115-2 extends the entire length of rigid pipe body 110-2 between a first end opening 116-2 and a second end opening 117-2 of pipe body 110-2. As indicated in FIG. 4(B), the removal of secondary material 57 generally involves transporting secondary material 57 through one or both of end openings 116-2 and 117-2, and exemplary removal processes are described below with reference to FIGS. 16 and 17.

FIGS. 3(C) and 4(C) show pipe body 110-2 after the curing/hardening process is completed, and also depict the subsequent process of charging pipe body 110-2 with an amount of working fluid according to block 230 of FIG. 2. In particular, these figures show the result of disposing an amount of working fluid 130 inside elongated central channel 115-2. As indicated in FIG. 4(B), the disposition of working fluid 130 into elongated central channel 115-2 generally involves injecting or drawing working fluid 130 through one or both of end openings 116-2 and 117-2, and exemplary charging processes are described below with reference to FIGS. 18 and 19. In alternative embodiments, the amount of working fluid 130 disposed in central channel 115-2 is either a predetermined/premeasured amount that is injected into central channel 115-2, or determined using a sensor (e.g., a pressure sensor) or another measuring mechanism during an evaporation portion of the charging process.

FIGS. 3(D) and 4(D) show the final process step in which sealing structures are mounted over end openings 116-2 and 117-2 of pipe body 110-2 to complete the production of microchannel heat pipe 100 according to block 240 of FIG. 2. In particular, these figures show the result of disposing a first sealing structure 140-1 over end opening 116-2 and a second sealing structure 140-2 over end opening 117-2, thereby enclosing elongated central channel 115-2 to encapsulate working fluid 130 therein. Exemplary sealing charging are described below with reference to FIGS. 18 and 19.

Figure 5:
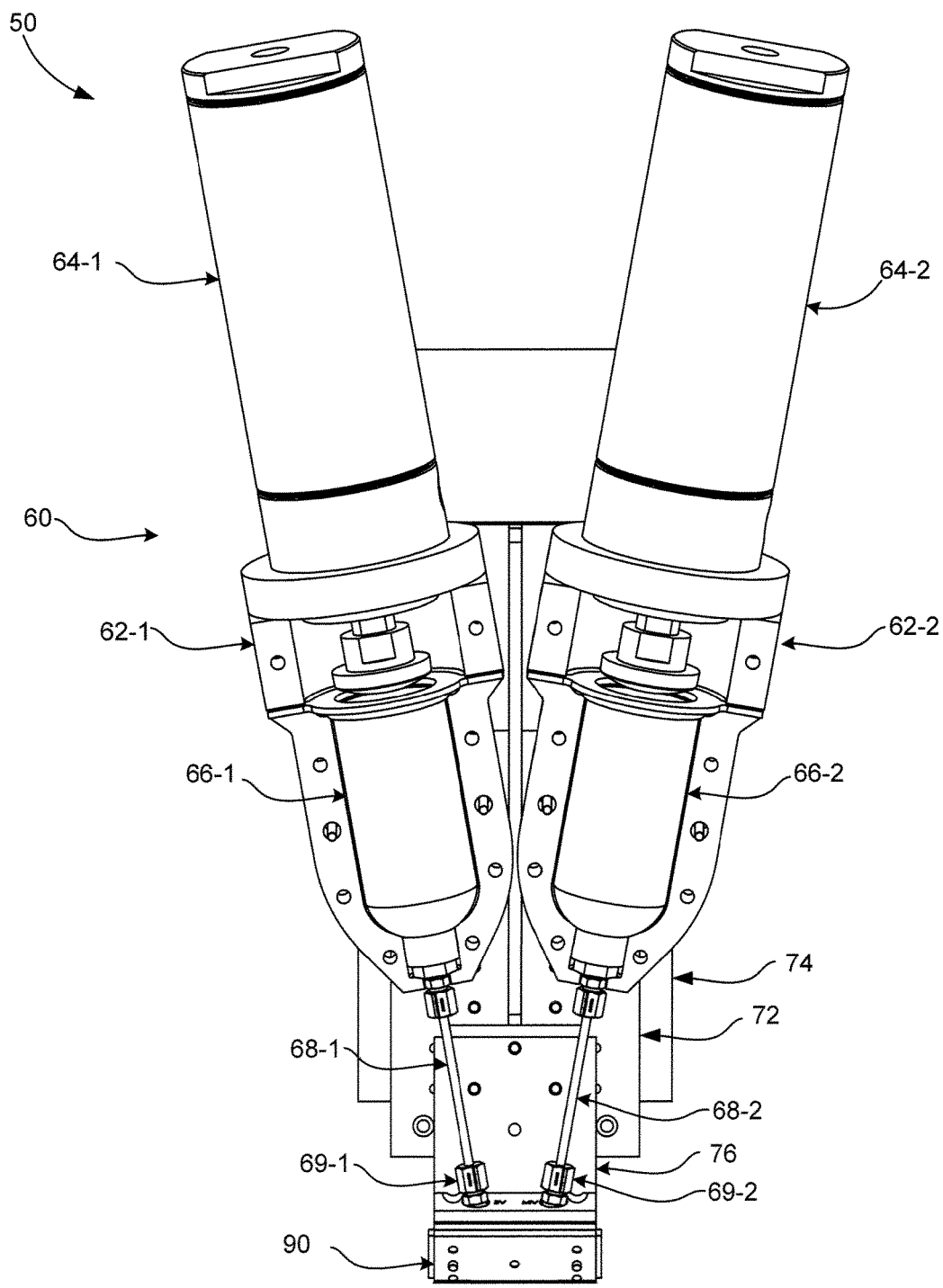
FIG. 5 is a front view showing a micro-extrusion system including a generalized co-extrusion printhead assembly utilized during the generalized method of FIG. 2 in accordance with an embodiment of the present invention.
Figure 6:
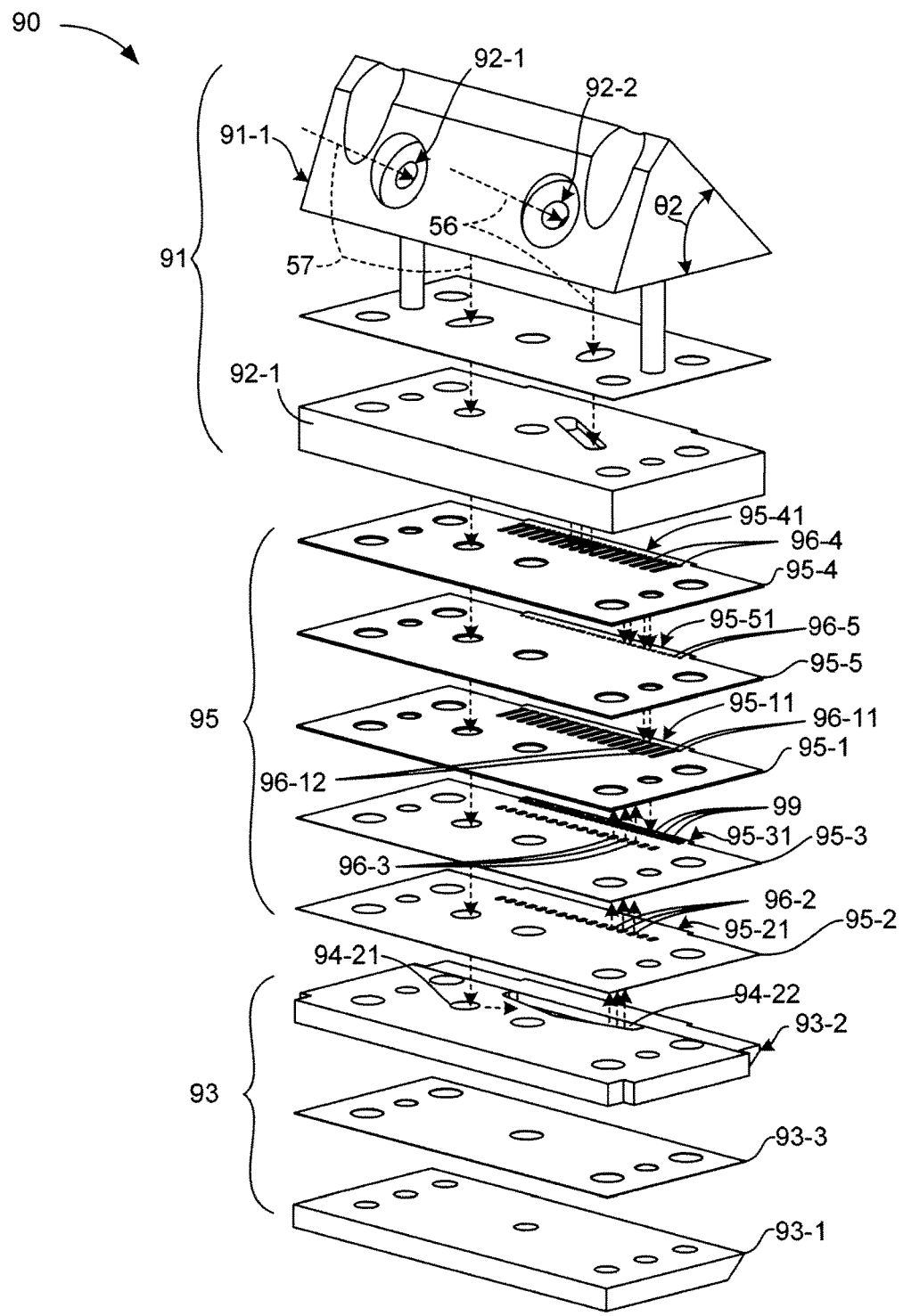
FIG. 6 is an exploded perspective view showing the co-extrusion printhead assembly of FIG. 5 in additional detail.
Figure 7:
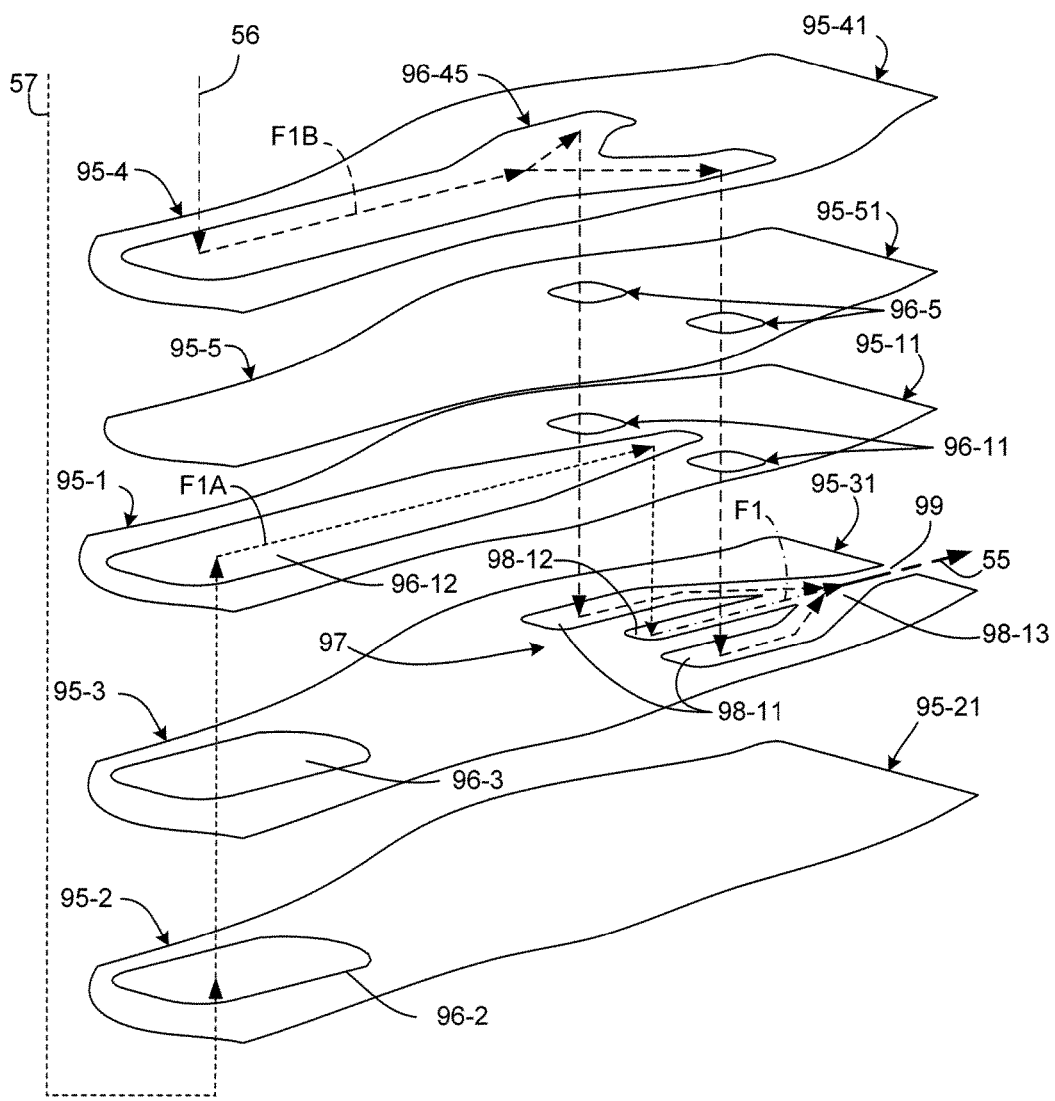
FIG. 7 is a simplified exploded partial perspective view showing a portion of a generalized layered nozzle structure utilized in the co-extrusion printhead assembly of FIG. 6.

FIGS. 5-7 illustrate a co-extrusion system 50 utilized to produce the microchannel heat pipes of the present invention according an embodiment of the present invention. As set forth below, co-extrusion system 50 is characterized by using one extruded material (i.e., fluid or paste) to focus or concentrate the flow of another extruded fluid/paste, thereby facilitating the creation of fine, high aspect ratio structures from print nozzles that are significantly wider than the high aspect ratio structures. However, unlike previous uses of co-extrusion system 50, where the high aspect ratio structures are retained in the final product, the novel process described herein includes removing the extruded high aspect ratio structures to define the elongated central channel of a pipe structure.

Referring to FIG. 5, system 50 generally includes a material feed mechanism 60 that supplies two extrusion materials to a co-extrusion printhead assembly 90, and an X-Y-Z axis positioning mechanism (not shown) that is used to move co-extrusion printhead assembly 90 over a target device (not shown). Material feed mechanism 60 supplies the two extrusion materials to co-extrusion printhead assembly 90 in response to control signals from a controller (not shown), and printhead assembly 90 is constructed to co-extrude the two extrusion materials in a manner that generates parallel high-aspect ratio structures (described below, e.g., with reference to FIG. 9). Referring to the upper portion of FIG. 5, material feed mechanism 60 includes a pair of housings 62-1 and 62-2 that respectively support pneumatic cylinders 64-1 and 64-2, which is operably coupled to cartridges 66-1 and 66-2 such that material forced from these cartridges respectively passes through feedpipes 68-1 and 68-2 into printhead assembly 90. As indicated in the lower portion of FIG. 5, the X-Y-Z axis positioning mechanism (partially shown) includes a Z-axis stage 72 that is movable in the Z-axis (vertical) direction by way of a housing/actuator 74 (partially shown) using known techniques. Mounting plate 76 is rigidly connected to a lower end of Z-axis stage 72 and supports printhead assembly 90, and a mounting frame (not shown) is rigidly connected to and extends upward from Z-axis stage 72 and supports pneumatic cylinders 64-1 and 64-2 and cartridges 66-1 and 66-2.

FIG. 6 is an exploded perspective view showing micro-extrusion printhead 90 in additional detail. Micro-extrusion printhead 90 generally includes a first (back) plate structure 91, a second (front) plate structure 93, and a layered nozzle structure 95 connected therebetween. Back plate structure 91 and front plate structure 93 serve to guide primary extrusion material 56 and secondary extrusion material 57 from corresponding inlet ports 96-1 and 96-2 to layered nozzle structure 95, and to rigidly support layered nozzle structure 95 such that extrusion nozzles defined in layered nozzle structure 95 are pointed toward the target substrate at a predetermined tilted angle (e.g., 45°), whereby extruded material traveling down each extrusion nozzle toward its corresponding nozzle orifice 99 is directed toward the target substrate.

Referring to the upper portion of FIG. 6, back plate structure 91 includes a molded or machined metal (e.g., aluminum) angled back plate 91-1, a back plenum 91-2, and a back gasket 91-3 disposed therebetween. Angled back plate 91-1 includes front and back surfaces that form a predetermined angle $\theta 2$ (e.g., 45°) that facilitates proper positioning of printhead 90 over a target device (substrate). Angled back plate 91 also defines a pair of bores (not shown) that respectively extend from threaded countersunk bore inlets 92-1 and 92-2 to corresponding conduits defined through back plenum 91-2 and a back gasket 91-3. The bores/conduits defined through back plate structure 91 feed extrusion materials 56 and 67 to layered nozzle structure 95 in the manner indicated by the dashed-line arrows.

Referring to the lower portion of FIG. 6, front plate structure 93 includes a molded or machined metal (e.g., aluminum) front plate 93-1, a front plenum 93-2, and a front gasket 93-3 disposed therebetween. Front plate 93-1 includes surfaces that form the predetermined angle described above, and defines several holes for attaching to other sections of printhead assembly 90, but does not channel extrusion material. Front plenum 93-2 includes parallel front and back surfaces, and defines a conduit (not shown) extending from a corresponding inlet to a corresponding outlet to support the flow of primary material 56 as indicated by the dashed-line arrows.

Layered nozzle structure 95 includes a top nozzle plate 95-1, a bottom nozzle plate 95-2, and a nozzle outlet plate 95-3 sandwiched between top nozzle plate 95-1 and bottom nozzle plate 95-2. As described in additional detail below, top nozzle plate 95-1 defines a row of substantially circular inlet ports (through holes) 96-11 and a corresponding series of elongated inlet ports 96-12 that are aligned adjacent to a front edge 95-11. Bottom nozzle plate 95-2 is a substantially solid (i.e., continuous) plate having a front edge 95-21, and defines several through holes 96-2, whose purposes are described below. Nozzle outlet plate 95-3 includes a front edge 95-31, and defines a row of three-part nozzle channels 97 that are described in additional detail below, and several through holes 96-3 that are aligned with through holes 96-2. When operably assembled, nozzle outlet plate 95-3 is sandwiched between top nozzle plate 95-1 and bottom nozzle plate 95-2 to form a series of nozzles in which each three-part nozzle channel 97 is enclosed by corresponding portions of top nozzle plate 95-1 and bottom nozzle plate 95-2 in the manner described above, with each part of three-part nozzle channel 97 aligned to receive material from two inlet ports 96-11 and one elongated inlet port 96-12. As described in additional detail below, this arrangement produces parallel high-aspect ratio structures in which secondary material 57 is pressed between two elongated side portions formed by primary material 56.

In addition to top nozzle plate 95-1, bottom nozzle plate 95-2 and nozzle outlet plate 95-3, layered nozzle structure 95 also includes a first feed layer plate 95-4 and a second feed layer plate 95-5 that are stacked over top nozzle plate 95-1 and serve to facilitate the transfer of the two extrusion materials to nozzle outlet plate 95-3 in the desired manner described below. First feed layer plate 95-4 is a substantially solid (i.e., continuous) plate having a front edge 95-41, and defines several Y-shaped through holes 96-4 located adjacent to front edge 95-51, and several additional holes for feeding material and for assembly. Second feed layer plate 95-5 is disposed immediately below first feel layer plate 95-4, includes a front edge 95-51, and defines several substantially circular through holes 96-5 located adjacent to front edge 95-51, and several feed and assembly holes.

As indicated by the dashed arrows in FIG. 6 and described in additional detail in FIG. 7, primary extrusion material 56 and secondary extrusion material 57 are fed by way of two separate paths in a substantially Z-axis direction through the various layers of layered nozzle structure 95 to nozzle outlet plate 95-3. The two flow paths are described in detail in the following paragraphs.

Referring to the upper portion of FIG. 6, secondary material 57 injected through inlet port 92-1 is fed downward through back plenum 91-2 and passes through aligned openings respectively formed in first feed layer plate 95-4, second feed layer plate 95-5, top nozzle plate 95-1, nozzle outlet plate 95-3, and bottom nozzle plate 95-2 before entering opening 94-21 of front plenum 93-2. As indicated in FIG. 6 and in additional detail in FIG. 7, secondary material 57 is then redirected by front plenum 93-2 and moves upward from opening 94-22 through opening 96-2 formed in bottom nozzle plate 95-2 and opening 96-3 formed in nozzle outlet plate 95-3. As indicated in the upper portion of FIG. 7, secondary material 57 then enters the rearward end of elongated openings 96-12, and is redirected in a substantially horizontal direction along the path indicated by arrow F1A to the front end of elongated opening 96-12. Secondary material 57 is then forced downward into a central channel 98-12 of three-part nozzle channel 97, then flows along central channel 98-12 in the direction of arrow F1 into a merge point 98-13 and onward toward dispensing orifice 99. In the manner described above, each central channel 98-12 communicates with inlet port 92-1 to pass secondary material 57 to an associated dispensing orifice 99. As explained in additional detail below, under selected operating conditions, the secondary material flowing along each central channel 98-12 in the direction of arrow F1 is compressed between corresponding primary material portions in merge point 98-13 before exiting from associated dispensing orifice 99.

Referring again to the upper portion of FIG. 6, primary material 56 injected through inlet port 92-2 is fed downward through back plenum 91-2, where it is dispersed and is passed into the rearward end of Y-shaped elongated channels 96-4, which are formed in first feed layer plate 95-4. As indicated by dashed arrows in FIG. 7, primary material 56 flows along each Y-shaped elongated channel 96-4 to a split front end region, where the primary material is distributed through corresponding openings 96-5 disposed in second feed layer plate 95-5 and openings 96-11 disposed in top nozzle plate 95-1, and then into opposing side channel 98-11 of three-part nozzle channel 97. As described in additional detail below, the primary material then flows along side channels 98-11, and at merge region 98-13 presses against the corresponding secondary material flowing from channel 98-11, thereby creating a two part flow 55 (made up of primary and secondary material) that then exits from orifice 99. Techniques for fabricating the printhead described above are described, for example, in co-owned U.S. Pat. No. 7,780,812, entitled "EXTRUSION HEAD WITH PLA-NARIZED EDGE SURFACE", which is incorporated herein by reference in its entirety.

Figure 8A:
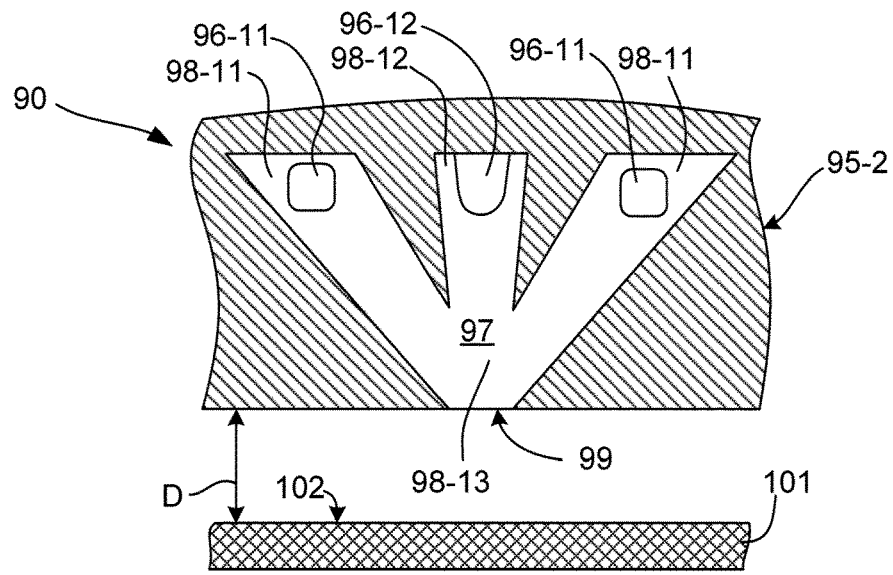
FIGS. 8(A) and 8(B) are partial cross-sectional views showing a simplified three-part fluidic channel defined in the co-extrusion printhead assembly of FIG. 6 prior to and during a co-extrusion process, respectively.

FIG. 8(A) is a simplified partial section view showing a portion of nozzle output plate 95-2, which in the exemplary embodiment includes a metal plate that is micro-machined (e.g., using deep reactive ion etching) to include arrowhead-shaped three-part nozzle channel 97 including a central channel 98-12 and opposing (first and second) side channels 98-11. Central channel 98-12 is separated from each side channel 98-11 by an associated tapered finger of plate material. Central channel 98-12 has a closed end that is aligned to receive secondary material from the front end of elongated opening 96-12 by way of the top nozzle plate, and an open end that communicates with merge point 98-13. Similarly, side channels 98-11 have associated closed ends that are aligned to receive primary material from corresponding openings 96-11 by way of the top nozzle plate, and open ends that communicate with merge point 98-13. Side channels 98-11 are angled toward central channel 98-12 such that primary material is directed toward opposing sides of the secondary material flowing from central channel 98-12 toward orifice 99.

Figure 8B:
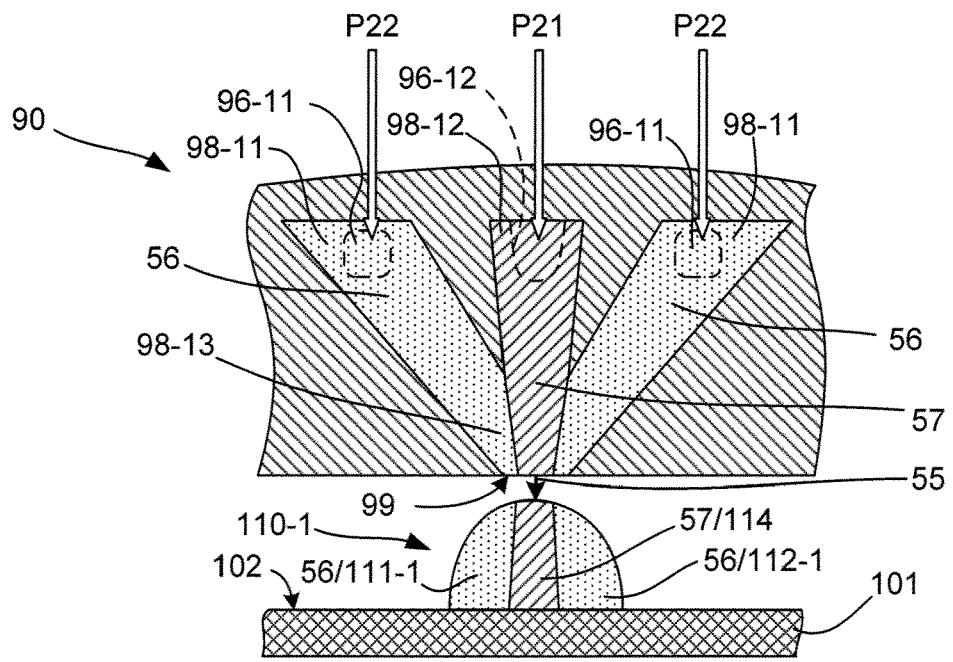

FIG. 8(B) shows the portion of nozzle output plate 95-2 (described above with reference to FIG. 8(A)) while primary and secondary materials are simultaneously co-extruded (forced) through co-extrusion printhead assembly 90 and out of nozzle outlet orifice 99, and also shows a cross-sectional end view of an exemplary elongated body structure 110-1 formed as a result of the co-extrusion process. A benefit of the co-extrusion approach described herein is that elongated body structure 110-1 includes a high-aspect ratio bead structure 114 in which secondary material is supported by primary material side portions 111-1 and 112-1, which are respectively disposed on opposing sides of bead structure 114. The shape of extruded structures (i.e., the aspect ratio of the central bead structure 114 and the shape of the primary side portions 111-1 and 111-2) are controllable through at least one of the shapes of the one or more outlet orifice 99, the internal geometry of printhead assembly 90, characteristics of the materials (e.g., viscosity, etc.), and the extrusion technique (e.g., flow rate, respective pressures P21 and P22 respectively applied to the secondary and primary materials, temperature, etc.). The structure within the printhead assembly and the shape of the nozzle outlet orifices may be modified to further enhance the extrusion process in order to generate the desired pipe shape.

Suitable primary materials include, but are not limited to, silver, copper, nickel, tin, aluminum, steel, alumina, silicates, glasses, carbon black, polymers and waxes, and suitable secondary (sacrificial) materials include plastic, oil, cellulose, latex, polymethylmethacrylate, etc., combinations thereof, and/or variations thereof, including combining the above with other substances to obtain a desired density, viscosity, texture, color, etc. In one embodiment, an ink/paste including a metal powder or a ceramic in a solvent is used as the extruded primary material, and then sintering is performed to solidify (densify) the pipe body structure. Alternatively, the metal/ceramic-based primary material is utilized to form the pipe body, and a sealing process is subsequently performed in which the entire pipe body structure (including the end openings) is covered with an epoxy after working fluid is disposed inside the central chamber.

Figure 9:
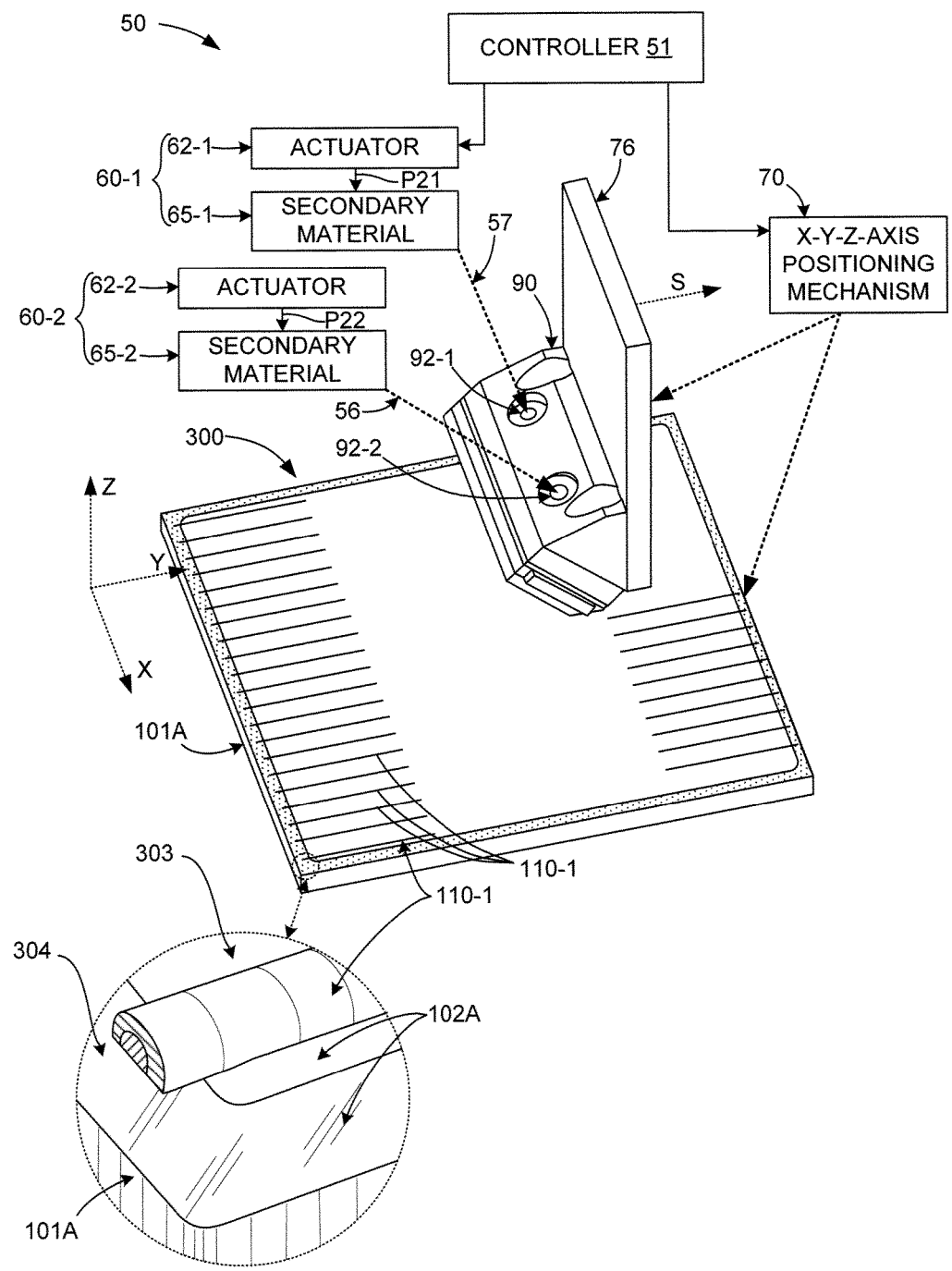
FIG. 9 is a partial perspective view showing the formation of microchannel heat pipes on an integrated circuit using the micro-extrusion system of FIG. 5 according to another specific embodiment of the present invention.

FIG. 9 is a simplified partial perspective view illustrating a portion of system 50 and an IC (host device) 300 including a semiconductor (e.g., silicon) substrate 101A, and in particular depicts the simultaneous formation of multiple elongated composite structures 110-1 on an upper surface 102A of substrate 101A using system 50 according to another embodiment of the present invention. As set forth above, system 50 generally includes a controller 51 that controls material feed mechanisms 60-1 and 60-2 and an X-Y-Z-axis positioning mechanism 70 to selectively force primary material 56 and secondary material 57 from printhead assembly 90 onto upper surface 102A of substrate 101A as described above in order to form multiple parallel elongated composite structures 110-1. Controller 51 (e.g., a microprocessor and associated software) is programmed according to known techniques to generate and transmit control signals to material feed mechanisms 60-1 and 60-2 and X-Y-Z-axis positioning mechanism 70 in accordance with the production methods. Material feed mechanism 60-1 includes an actuator 62-1 that is operably disposed to supply a pressure P21 to a secondary material source 65-1, whereby secondary material 57 is forced from material source 65-1 through inlet ports 92-1 into printhead assembly 90. Similarly, material feed mechanism 60-2 includes an actuator 62-2 that is operably disposed to supply a pressure P22 to a primary material source 65-2, whereby primary material 56 is forced from material source 65-2 through inlet ports 92-2 into printhead assembly 90. X-Y-Z-axis positioning mechanism 70 generally includes mounting plate 76 for rigidly supporting and positioning printhead assembly 90 relative to substrate 101A, a base (not shown) for supporting substrate 101, and one or more motors, associated positioning structures (not shown) and control circuitry that facilitate relative movement of printhead assembly 90 relative to substrate 101A in response to control signals received from controller 51. Suitable X-Y-Z positioning mechanisms are well known to those skilled in the art. Utilizing this approach, as indicated in FIG. 9, multiple elongated composite structures 110-1 are formed on substrate 101A, with a second portion of each structure 110-1 disposed over a central "active" (heat generating) region 303 of IC 300 (i.e., CMOS circuitry that is disposed in substrate 101A), and a second portion of each structure 110-1 disposed over a peripheral "inactive" region (or heat sink structure) 304, which is also provided on substrate 101A and spaced from "active" region 303 of IC 300. By completing the production method described herein, each of these elongated composite structures 110-1 can be formed into a microchannel heat pipe of the present invention that is disposed to transfer heat from active (hot) central region 303 of IC 300 to peripheral inactive (cool) region 304 of IC 300. Note that FIG. 9 is provided for descriptive purposes, and the depicted structures are not necessarily to scale. In other embodiments, microchannel heat pipes 100 may be formed on a bare metal, semiconductor, ceramic, or other substrate that is then attached, for example, to the upper or lower surface of an IC device or other host device. Other host devices to which micro-channel heat pipes 100 may be attached include an LED, a laser diode, or other solid state device that generates hear, a thermoelectric device or other device that provides active cooling, a heat sink, or other device that provides passive cooling.

FIGS. 10(A) to 15(C) depict several specific embodiments for forming elongated composite structures utilizing the co-extrusion process described above.

FIGS. 10(A) to 10(C) depict a first specific embodiment involving a two-part process that is utilized to produce elongated composite structures. FIG. 10(A) depicts a first part of the two-part process, and involves co-extruding a primary material 56A-1 and a secondary material 57A in the manner described above to produce a preliminary composite structure including side structures 111A-1 and 112A-1 and a central bead 114A disposed therebetween. Note that the preliminary composite structure shown in FIG. 10(A) is formed such that an upper surface of central bead 114A is exposed (i.e., not covered by primary material). FIG. 10(B) depicts composite structure 110A-1 after a second part of the two-part process in which a third material 56A-2 (which is either identical to primary material 56A-1 or suitably compatible) is extruded or printed onto the preliminary composite structure, whereby the third material forms an elongated upper portion 113A-1 that extends between upper edges of elongated side portions 111A-1 and 112A-1 such that a central portion of upper wall 113A-1 is supported by bead 114A (i.e., by secondary material 57A). FIG. 10(C) depicts a resulting pipe structure 110A-2 after subsequent curing/hardening of the primary and third materials to form side walls 111A-2 and 112A-2 and upper wall 113A-2, and the removal of the secondary material to form central channel 115A-2, which is defined by inside surfaces of walls 111A-2, 112A-2 and 113A-2 and exposed substrate surface portion 102-2. An advantage of this first approach is that coextruding materials side-by-side can simplify the printhead, although this approach requires two extrusion steps.

FIGS. 11(A) and 11(B) depict a second specific embodiment in which the co-extrusion process is performed using a modified co-extrusion printhead including a fourth nozzle inlet to the material merge point such that primary material 56B is simultaneously extruded onto the upper surface of secondary material 57B, which forms central bead 114B, whereby side portions 111B-1 and 112B-1 and an upper portion 113B-1 are formed during a single co-extrusion pass. Suitable printhead modifications capable of generating such vertical layering are described, for example, in co-owned U.S. Pat. No. 7,765,949, which is incorporated herein by reference in its entirety. FIG. 11(A) depicts composite structure 110B-1 formed by this method immediately after the co-extrusion process, and FIG. 11(B) depicts a resulting pipe structure 110B-2 after subsequent curing/hardening of the primary material to form side walls 111B-2 and 112B-2 and an upper wall 113B-2, and the removal of the secondary material to form central channel 115B-2 (which is bounded at its lower end by substrate surface portion 102-2. An advantage of this second approach is that the heat pipe can be formed with a single extrusion step.

Figure 12A:
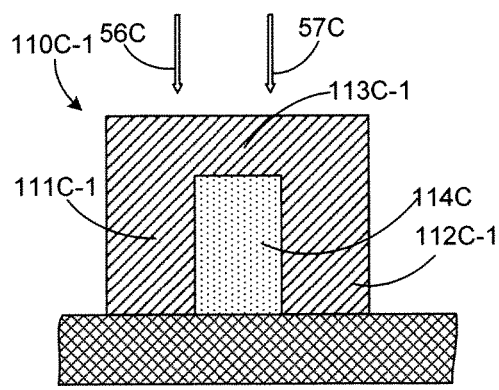
FIGS. 12(A), 12(B) and 12(C) are cross-sectional side views illustrating the formation of a co-extruded pipe structure according to a third specific embodiment of the present invention.
Figure 12B:
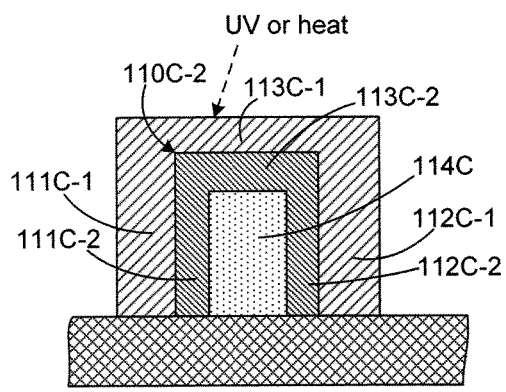
Figure 12C:
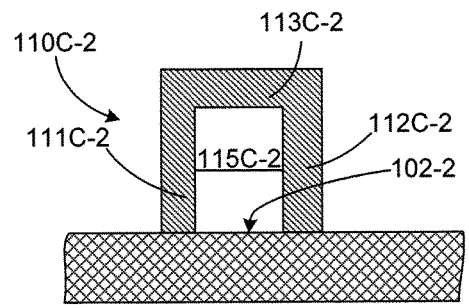

FIGS. 12(A) to 12(C) depict a third specific embodiment involving polymerization of a portion of the co-extruded primary and secondary materials to form a polymer structure that serves as the desired rigid pipe body. FIG. 12(A) depicts the co-extrusion of a primary material 56C and a secondary material 57C using any of the techniques described above to produce a preliminary composite structure 110C-1 including side portions 111C-1 and 112C-1, a central bead 114C disposed therebetween, and an upper portion 113C-1 that extends over central bead 114C. In this embodiment primary material 56C includes both a catalyst and a monomer, and FIG. 12(B) depicts a subsequent polymerization process that causes at least a portions of the primary material forming side portions 111C-1 and 112C-1 and upper portion 113C-1 to generate a polymer structure (pipe body) 110C-2 that surrounds central bead 114C. In one specific embodiment the catalyst comprises an ultraviolet (UV) reactive material, and activating the catalyst comprises illuminating the primary material with UV light, as indicated in FIG. 12(B). In another specific embodiment the catalyst and polymer are selected such that the polymerizing reaction just requires thermal heat, and in this case the catalyst is supplied to the co-extrusion printhead through a third inlet, and the printhead is modified to combine (mix) the catalyst with the primary material/monomer immediately before leaving the orifice (e.g., in the merge point). FIG. 12(C) depicts pipe structure 110C-2 after subsequent removal of any remaining non-polymerized primary material and secondary material, whereby a central channel 115C-2 is formed that is defined by inside surfaces of side walls 111C-2 and 112C-2 and upper wall 113C-2 of polymer structure (pipe body) 110C-2, and by surface portion 102-2. An advantage of this third approach is that the primary and secondary materials can be co-extruded (printed) at room temperature, and then solidified to form the solid walls.

Figure 13A:
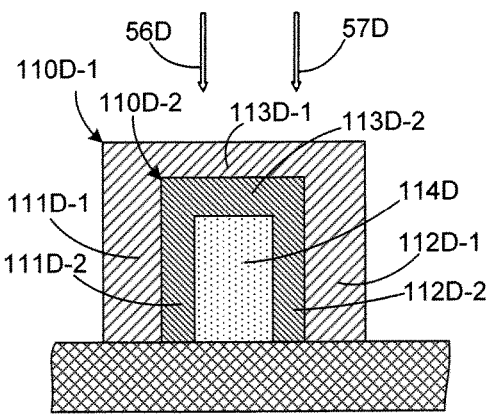
FIGS. 13(A) and 13(B) are cross-sectional side views illustrating the formation of a co-extruded pipe structure according to a fourth specific embodiment of the present invention.
Figure 13B:
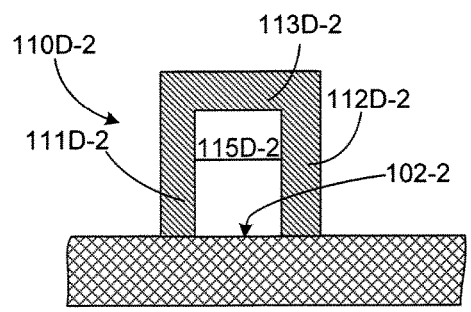

FIGS. 13(A) and 13(B) depict a fourth specific embodiment involving polymerization that occurs at an interface between the co-extruded primary and secondary materials to form a polymer structure that serves as the desired rigid pipe body. FIG. 13(A) depicts the co-extrusion of a primary material 56D and a secondary material 57D using any of the techniques described above to produce a preliminary composite structure 110D-1 including side portions 111D-1 and 112D-1, a central bead 114D disposed therebetween, and an upper portion 113D-1 that extends over central bead 114D. In this embodiment primary material 56D includes a catalyst and secondary material 57D includes a monomer (or vice versa) such that a polymerization process occurs at an interface of the co-extruded materials, whereby portions of the primary and secondary materials generate a polymer structure (pipe body) 110D-2 that surrounds central bead 114D. FIG. 13(b) depicts pipe structure 110D-2 after subsequent removal of any remaining unpolymerized primary material and secondary material, whereby a central channel 115D-2 is formed that is defined by inside surfaces of side walls 111D-2 and 112D-2 and an upper wall 113D-2 of polymer structure (pipe body) 110D-2, and by surface portion 102-2. Advantages of this fourth approach are potentially lower material costs than the other embodiments, and, because polymerization occurs only at the interface between the primary and secondary materials, the resulting polymer walls may be thinner than in the other polymerizing approaches, thus providing improved heat transfer through the polymer walls.

Figure 14A:
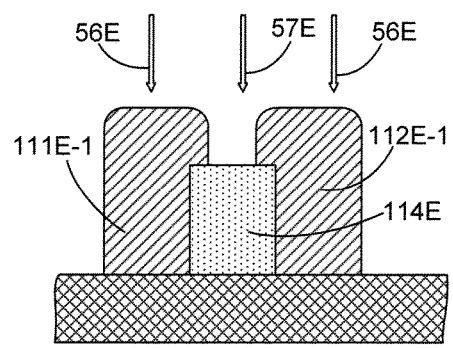
FIGS. 14(A), 14(B) and 14(C) are cross-sectional side views illustrating the formation of a co-extruded pipe structure according to a fifth specific embodiment of the present invention.
Figure 14B:
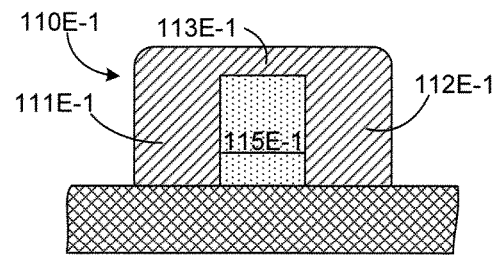
Figure 14C:
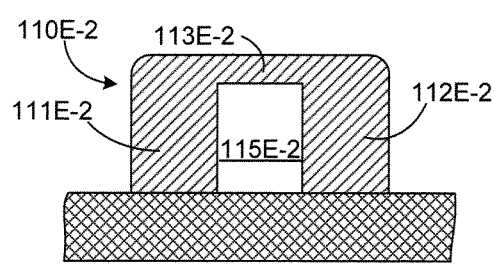

FIGS. 14(A) to 14(C) depict a fifth specific embodiment in which a primary material 56E and a secondary material 57E are co-extruded or formulated in a way that promotes the flow of primary fluid 56E over the upper surface of a central bead 114E during or after the co-extrusion process. In one alternative of this embodiment, the interior channels of the printhead are manufactured in such a way that contact between primary material 56E and the top of the channel is more energetically favorable than contact between secondary fluid 57E and the top of the channel. Given the layer-by-layer construction of the printhead, this objective could be achieved either through materials selection of the layer that defines the top of the channel, or by specially treating the surface of that layer. Given a long enough fluid path, the co-flowing streams should reorient themselves to reduce total surface energy, with primary fluid 56E surrounding secondary fluid 57E on three sides. An advantage of this fifth approach is that materials are extruded side-by-side, allowing a simpler printhead, while still requiring a single extrusion step.

Figure 15A:
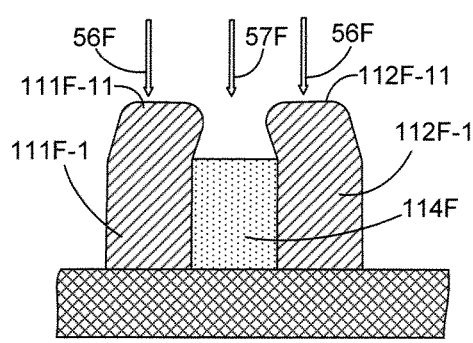
FIGS. 15(A), 15(B) and 15(C) are cross-sectional side views illustrating the formation of a co-extruded pipe structure according to a sixth specific embodiment of the present invention.
Figure 15B:
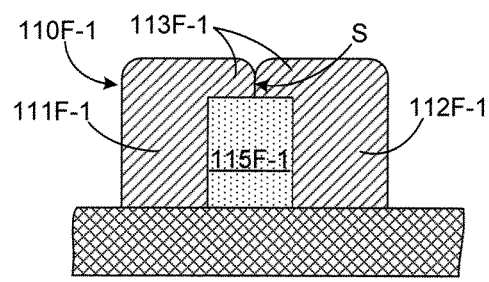
Figure 15C:
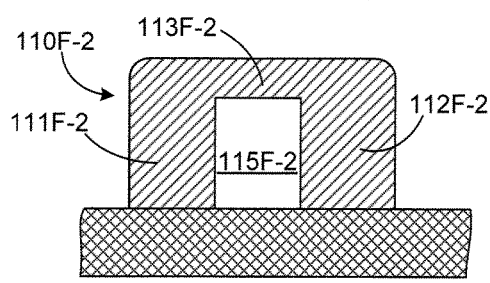

FIGS. 15(A) to 15(C) depict a sixth specific embodiment in which a primary material 56F and a secondary material 57F are co-extruded and/or subsequently treated in a way that promotes "slumping" of primary fluid 56F from side portions 111F-1 and 112F-1 over the upper surface of a central bead 114F after the co-extrusion process. In this embodiment the shape of the extrusion nozzles are formed such that uppermost portions 111F-11 and 112F-11 of side portions 111F-1 and 112F-1 extend higher above the substrate than the upper surface of central bead 114F, as indicated in FIG. 15(A). Alternatively, the two materials can be extruded to form structures having the same height, but with the fluid properties selected such that, upon cooling or drying, the volume of secondary material 57F reduces more rapidly than that of primary material 56F. In this way, as indicated in FIG. 15(B), side portions 111F-1 and 112F-1 collapse or "slump" to meet at a seam S above central bead 114F, thereby forming an upper portion 113F-1 that seals the channel region containing central bead 114F. FIG. 15(C) depicts pipe structure 110F-2 after subsequent curing/hardening of the primary material portions and removal of the secondary material, whereby a central channel 115F-2 is formed that is defined by inside surfaces of side walls 111F-2 and 112F-2 and upper wall 113F-2 of the resulting pipe body 110F-2. An advantage of this sixth approach is that materials are extruded side-by-side, allowing a simpler printhead, while still requiring a single extrusion step.

Each of the above specific embodiments includes removal of the secondary fluid (central bead) from the central channel in order to complete the formation of the desired pipe body structure. Removal of the secondary material can be performed by one of several possible methods, including two methods described below with reference to FIGS. 16(A), 16(B) and 17. The methods described below are intended to be illustrative of the presently preferred approaches, and not intended to be comprehensive.

Figure 16A:
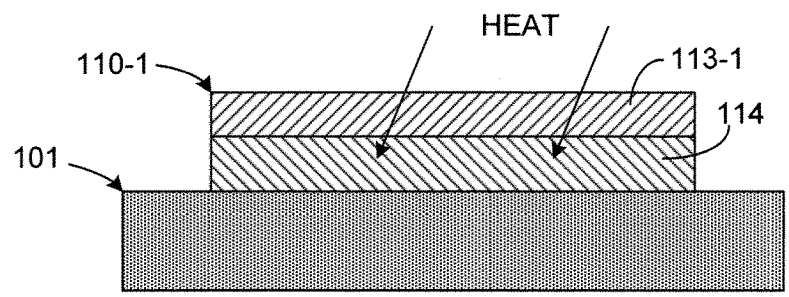
FIGS. 16(A) and 16(B) are cross-sectional side views illustrating the removal of secondary material from a pipe structure according to another specific embodiment of the present invention.
Figure 16B:
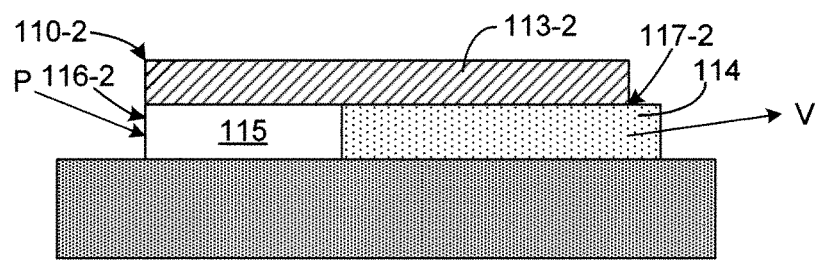

FIGS. 16(A) and 16(B) are simplified cross-sectional side views showing an elongated composite structure 110-1 formed in accordance with any of the embodiments set forth above, and in particular shows central bead 114 and upper portion 113-1 disposed on substrate 101. In this specific embodiment, the secondary material forming central bead 114 maintains a liquid form during co-extrusion and the subsequent primary material hardening process (e.g., curing by way of the application of heat, as indicated in FIG. 16(A)). As indicated in FIG. 16(B), once the primary material hardens (e.g., upper portion 113-1 becomes upper wall 113-2 in the manner described above), removal of the secondary material (bead 114) is performed by pumping the liquid out of the elongated central region using either pressurized gas P or a vacuum V (or both) to create a pressure differential between end openings 116-2 and 117-2. In another specific embodiment, the secondary material can be designed to have a lower melting temperature than the primary material, and the removal process involves heating composite structure 110-1 to temperature above a melting point of central bead 114 and below a melting point of the pipe structure (e.g., upper portion 113-1) as indicated in FIG. 16(A), and then removing the melted secondary material from the elongated central region/channel 115 of hardened pipe body 110-2 by pumping (e.g., as shown in FIG. 16(B)).

Figure 17:
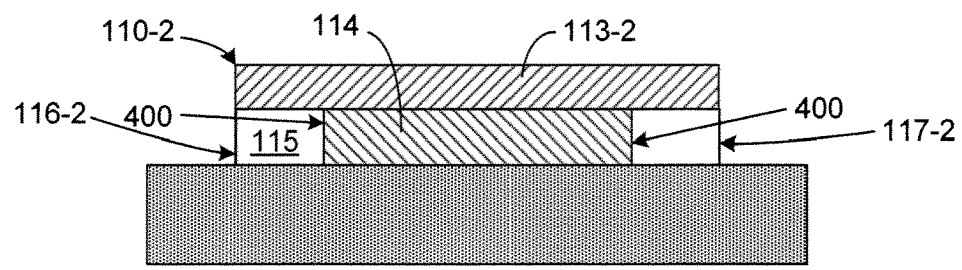
FIG. 17 is a cross-sectional side view illustrating the removal of secondary material from a pipe structure according to another specific embodiment of the present invention.

FIG. 17 is are simplified cross-sectional side views showing a hardened pipe body 110-2 formed in accordance with any of the embodiments set forth above. In this specific embodiment, the secondary material forming central bead 114 is removed by applying a selective etchant 400 that dissolves the secondary material forming central bead 114, but does not dissolve the primary material forming, e.g., upper wall 113-2.

As set forth above, after the desired pipe body structure is formed using any of the above specific embodiments and the secondary material is removed, "charging" of the microchannel heat pipe is then performed by disposing a working fluid inside the elongated central channel, and then the elongated central channel is sealed. Charging and sealing can be performed by one of several possible methods, including two methods described below with reference to FIGS. 18(A) to 18(C) and 19(A) to 19(C). The methods described below are intended to be illustrative of the presently preferred approaches, and not intended to be comprehensive.

Figure 18A:
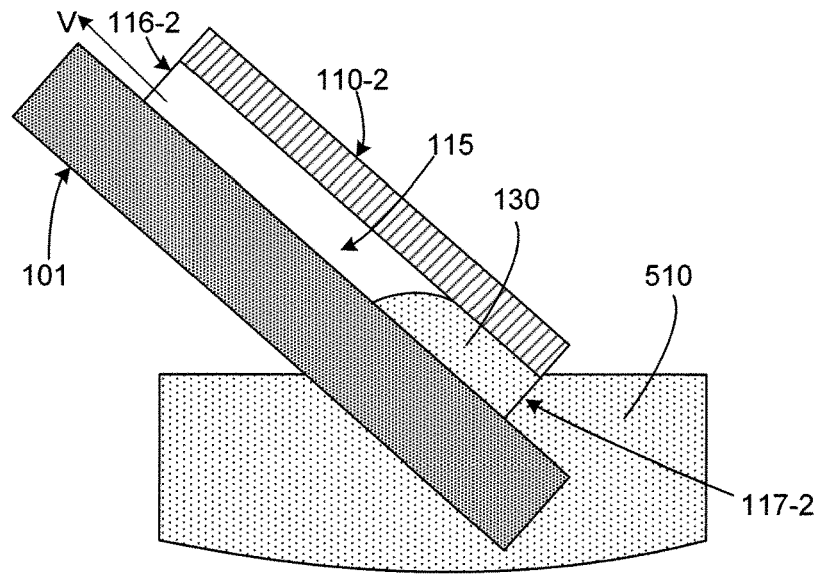
FIGS. 18(A), 18(B) and 18(C) are cross-sectional side views illustrating charging the pipe structure with working fluid according to another specific embodiment of the present invention.
Figure 18B:
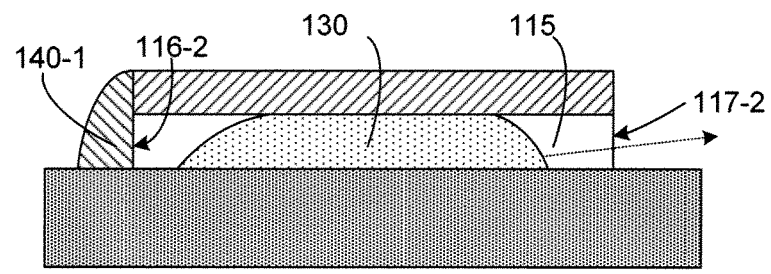
Figure 18C:
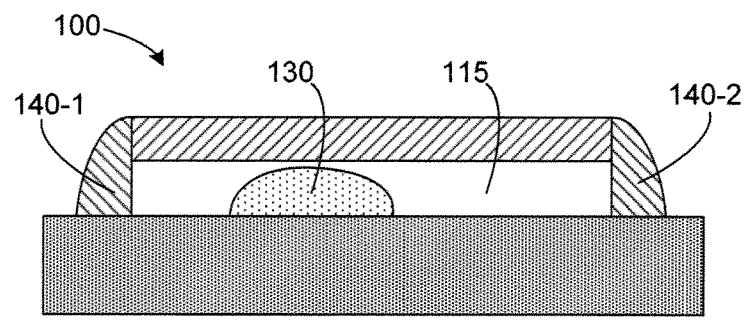

FIGS. 18(A) to 18(C) are simplified cross-sectional side views showing a pipe body 110-2 formed on a substrate 101 in accordance with any of the embodiments set forth above. FIG. 18(A) shows pipe body 110-2 and substrate 101 positioned such that end opening 117-2 is disposed in a pool 510 containing a working fluid, with an optional vacuum V (or other low pressure) present at end opening 116-2, whereby working fluid 130 is drawn into elongated central chamber 115 from pool 510 through end opening 117-2 by way of capillary action, displacing the air present in elongated central chamber 115. As indicated in FIG. 18(B), once elongated central chamber 115 is filled with working fluid 130, one end of pipe body 110-2 (e.g., end opening 116-2) is sealed by way of a first sealing structure (e.g., sealing structure 140-1), and then an amount of the working fluid inside elongated central chamber 115 is allowed to evaporate until the desired amount remains, at which time the second end (e.g., end opening 117-2) is sealed (e.g., by way of sealing structure 140-2), thereby completing microchannel heat pipe 100.

Figure 19A:
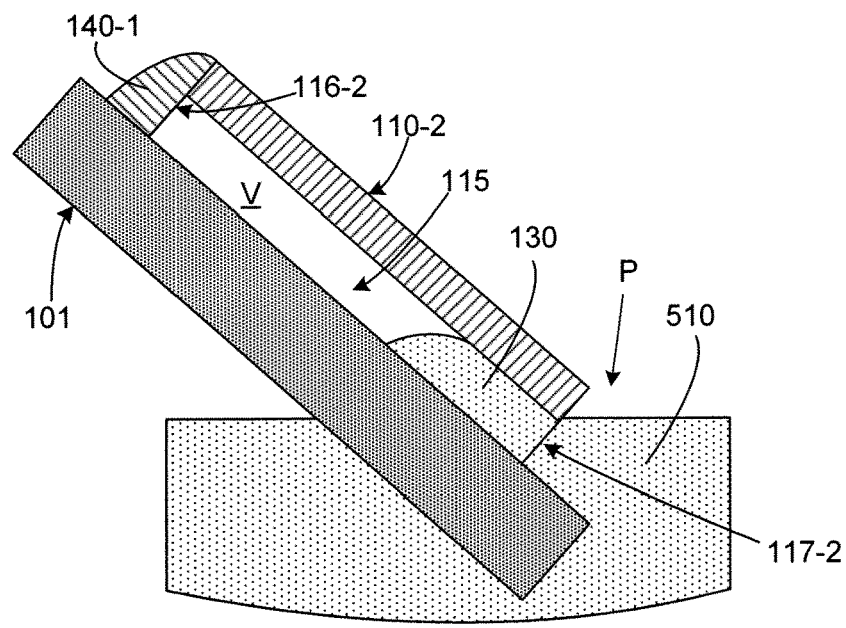
FIGS. 19(A), 19(B) and 19(C) are cross-sectional side views illustrating charging the pipe structure with working fluid according to another specific embodiment of the present invention.
Figure 19B:
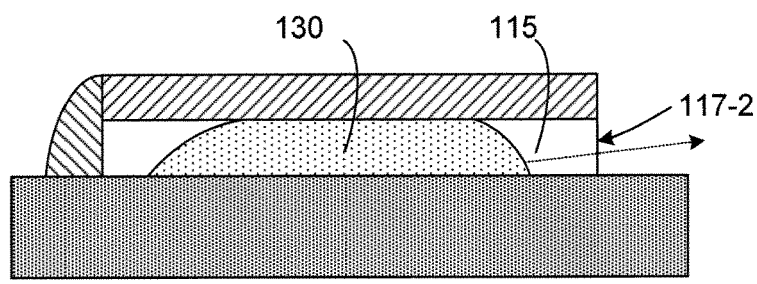
Figure 19C:
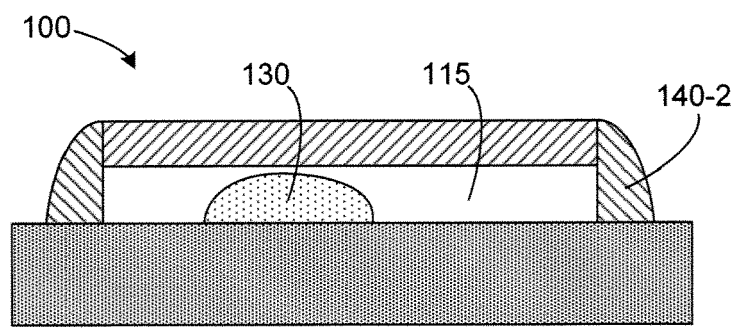

FIGS. 19(A) to 19(C) are simplified cross-sectional side views showing charging and sealing of pipe body 110-2 according to an alternative approach. FIG. 19(A) shows pipe body 110-2 and substrate 101 positioned such that end opening 117-2 is disposed in pool 510, as in the previous embodiment. However, in this case end opening 116-2 has already been sealed by way of sealing structure 140-1, and pipe body 110-2 has been placed in a pressure chamber set such that a vacuum V (or other low pressure) is present in central chamber 115. This arrangement (which can be enhanced, for example, by allowing the chamber pressure P to increase) causes working fluid 130 to draw into elongated central chamber 115 from pool 510 through end opening 117-2 by way of capillary action. As indicated in FIG. 19(B), once elongated central chamber 115 is filled with working fluid 130, an amount of the working fluid inside elongated central chamber 115 is allowed to evaporate through end opening 117-2 until the desired amount remains, at which time the second end (e.g., end opening 117-2) is sealed (e.g., by way of sealing structure 140-2), thereby completing microchannel heat pipe 100.

In a third method, which is presently preferred, the heat pipe is placed in a pressure chamber filled with a dry gas, such as nitrogen. One end of the heat pipe is placed in a pool of the working fluid, similar to the approach shown in FIG. 18(A) so that the fluid is drawn into the heat pipe via capillary action, or the working fluid is injected into the heat pipe. When the desired amount of fluid is in the pipe, both ends are sealed.

Figure 20A:
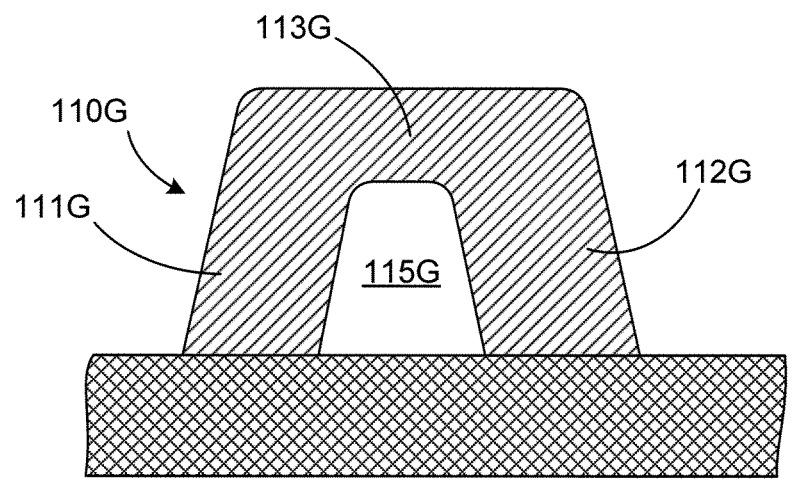
FIGS. 20(A) and 20(B) are cross-sectional end views showing pseudo-trapezoidal and pseudo-triangular pipe structures according to alternative specific embodiments of the present invention.
Figure 20B:
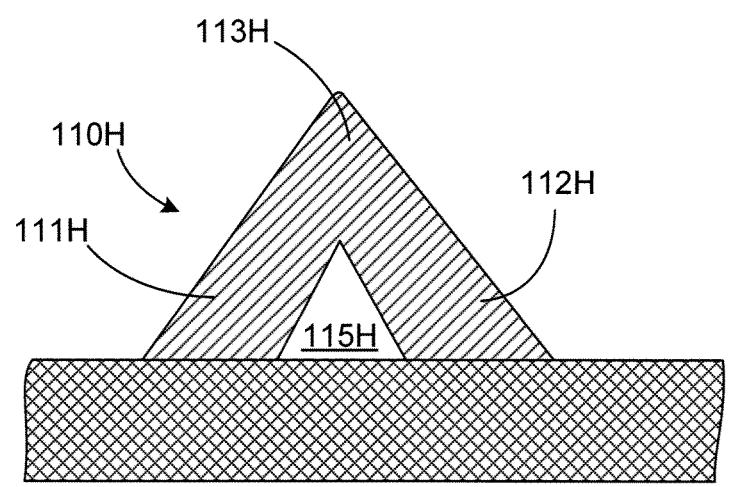

Although the present invention has been described with respect to certain specific embodiments, it will be clear to those skilled in the art that the inventive features of the present invention are applicable to other embodiments as well, all of which are intended to fall within the scope of the present invention. For example, although the present invention is described with reference to the use of micro extrusion printheads that form high-aspect ratio central beads, other co-extrusion printheads may also be used that do not form the secondary (sacrificial) material as a high aspect ratio bead. Further, elongated pipe body structures having cross-sectional shapes other than the substantially semi-circular (e.g., FIG. 1) and substantially square/rectangular (e.g., see FIG. 11(B)) may also be formed using the methods described above, including that of pipe body 110G shown in FIG. 20(A) (i.e., where side walls 111G and 112G and upper wall 113G of pipe body 110G form a pseudo-trapezoidal shape) or that of pipe body 110H shown in FIG. 20(B) (i.e., where side walls 111H and 112H and upper wall 113H of pipe-body 110H form a pseudo-triangular shape).

The invention claimed is:

1. A microchannel heat pipe disposed on a substrate, the microchannel heat pipe comprising:
    an elongated pipe body including first and second elongated side wall portions that are disposed on a surface of the substrate and separated by an elongated central channel, and an upper wall portion extending between said first and second elongated side wall portions over the elongated central channel, whereby the elongated central channel is defined by the first and second elongated side wall portions, the upper wall portion and a portion of the substrate surface extending between said first and second elongated side portions; and
    a working fluid encapsulated inside the elongated central channel,
    wherein the first and second elongated side wall portions and the upper wall portion comprise an integral structure consisting of a common hardened extrudable material, and
    wherein the common hardened extrudable material comprises at least one of a paste and an ink including one or more of silver, copper, nickel, tin, aluminum, steel, alumina, silicates, glasses, carbon black, polymers and wax.

2. The microchannel heat pipe of claim 1, wherein the elongated pipe body has a nominal width in the range of 10 micrometers to 500 micrometers, a length in the range of 100 micrometers to 20 centimeters, and a nominal height in the range of 25 micrometers to 500 micrometers.

3. The microchannel heat pipe of claim 2, wherein the elongated pipe body has a nominal width in the range of 30 micrometers to 200 micrometers, a length in the range of 10 to 100 millimeters, and a nominal height in the range of 30 micrometers to 200 micrometers.

4. The microchannel heat pipe of claim 1, wherein the first and second elongated side wall portions and the upper wall portion comprise a cross-sectional shape that is one of semi-circular, square, rectangular, trapezoidal and triangular.

5. The microchannel heat pipe of claim 1, wherein the first and second elongated side wall portions and the upper wall portion comprise a sintered metal.

6. The microchannel heat pipe of claim 1, wherein the first and second elongated side wall portions and the upper wall portion comprise a polymer.

7. The microchannel heat pipe of claim 1, wherein the working fluid comprises one of methanol, ethanol, water, acetone, and ammonia.

8. The microchannel heat pipe of claim 1, further comprising first and second sealing structures respectively disposed over opposing end openings defined in the pipe body that communicate with the elongated central channel.

9. The microchannel heat pipe of claim 8, wherein the first and second sealing structures respectively comprise one of epoxy, silicone and solder.

10. A microchannel heat pipe disposed on a substrate, the microchannel heat pipe comprising:

an elongated pipe body including first and second elongated side wall portions that are disposed on a surface of the substrate and separated by an elongated central channel, and an upper wall portion extending between said first and second elongated side wall portions over the elongated central channel, whereby the elongated central channel is defined by the first and second elongated side wall portions, the upper wall portion and a portion of the substrate surface extending between said first and second elongated side portions; and a working fluid encapsulated inside the elongated central channel, wherein the first and second elongated side wall portions and the upper wall portion comprise a polymer structure consisting of a hardened extruded polymer material.

11. The microchannel heat pipe of claim 10, wherein the elongated pipe body has a nominal width in the range of 10 micrometers to 500 micrometers, a length in the range of 100 micrometers to 20 centimeters, and a nominal height in the range of 25 micrometers to 500 micrometers.

12. The microchannel heat pipe of claim 11, wherein the elongated pipe body has a nominal width in the range of 30 micrometers to 200 micrometers, a length in the range of 10 to 100 millimeters, and a nominal height in the range of 30 micrometers to 200 micrometers.

13. The microchannel heat pipe of claim 10, wherein the first and second elongated side wall portions and the upper wall portion comprise a cross-sectional shape that is one of semi-circular, square, rectangular, trapezoidal and triangular.

14. The microchannel heat pipe of claim 10, wherein the working fluid comprises one of methanol, ethanol, water, acetone, and ammonia.

15. The microchannel heat pipe of claim 10, further comprising first and second sealing structures respectively disposed over opposing ends of elongated central channel.

16. The microchannel heat pipe of claim 15, wherein the first and second sealing structures respectively comprise one of epoxy, silicone and solder.

17. A device comprising:
a substrate having an upper surface;
a heat generating region formed in the substrate; and
a microchannel heat pipe disposed on the substrate, the microchannel heat pipe including:
an elongated pipe body including first and second elongated side wall portions that are disposed on a surface of the substrate and separated by an elongated central channel, and an upper wall portion extending between said first and second elongated side wall portions over the elongated central channel, whereby the elongated central channel is defined by the first and second elongated side wall portions, the upper wall portion and a portion of the substrate surface extending between said first and second elongated side portions; and
a working fluid encapsulated inside the elongated central channel,
wherein the pipe body comprises at least one of a hardened paste and a hardened ink including one or more of silver, copper, nickel, tin, aluminum, steel, alumina, silicates, glasses, carbon black, polymers and wax, and
wherein the elongated pipe body is disposed on the substrate such that the heat generating region is disposed under a first end of the microchannel heat pipe, and a second end of the microchannel heat pipe is disposed adjacent to a heat sink region of the device that is spaced from the heat generating region.

18. The device of claim 17, wherein the device comprises an integrated circuit including a central active region formed in the substrate under the first end of the microchannel heat pipe, and a peripheral inactive region disposed on the substrate and located under the second end of the microchannel heat pipe.

19. The device of claim 17, wherein the first and second elongated side wall portions and the upper wall portion comprise an integral structure consisting of a common material.

* * * * *